United States Patent [19]

Shimizu et al.

[11] Patent Number: 5,060,034
[45] Date of Patent: Oct. 22, 1991

[54] MEMORY DEVICE USING THIN FILM TRANSISTORS HAVING AN INSULATION FILM WITH SI/N COMPOSITION RATIO OF 0.85 TO 1.1

[75] Inventors: Hideaki Shimizu, Inagi; Nobuyuki Yamamura, Hanno; Hiroyasu Yamada, Fussa; Haruo Wakai, Hamura; Hiroshi Matsumoto, Tachikawa, all of Japan

[73] Assignee: Casio Computer Co., Ltd., Tokyo, Japan

[21] Appl. No.: 427,252

[22] Filed: Oct. 25, 1989

[30] Foreign Application Priority Data

| Nov. 1, 1988 | [JP] | Japan | 63-274444 |
| Dec. 14, 1988 | [JP] | Japan | 63-313811 |
| Jan. 26, 1989 | [JP] | Japan | 1-15164 |
| May 12, 1989 | [JP] | Japan | 1-117581 |
| May 12, 1989 | [JP] | Japan | 1-117583 |

[51] Int. Cl.[5] .................. H01L 29/68; H01L 27/01; H01L 27/13; H01L 29/78
[52] U.S. Cl. .................. 357/23.5; 357/23.7; 357/4; 357/42; 357/54
[58] Field of Search .............. 357/23.7, 42, 54, 4, 357/23.5

[56] References Cited

U.S. PATENT DOCUMENTS

| 4,057,788 | 11/1977 | Sage | 357/54 |
| 4,057,821 | 11/1977 | Patel | 357/54 |
| 4,161,038 | 7/1979 | Wu | 357/42 |
| 4,353,083 | 10/1982 | Trudel et al. | |
| 4,395,726 | 7/1983 | Maeguchi | 357/23.7 |
| 4,481,527 | 11/1984 | Chen et al. | |
| 4,619,034 | 10/1986 | Janning | 357/23.7 |
| 4,686,558 | 8/1987 | Adam | |
| 4,803,530 | 2/1989 | Taguchi et al. | 357/23.7 |
| 4,804,637 | 2/1989 | Smayling et al. | |
| 4,821,092 | 4/1989 | Noguchi | |

FOREIGN PATENT DOCUMENTS

| 0017709A1 | 10/1980 | European Pat. Off. | |
| 0271932A2 | 6/1988 | European Pat. Off. | |
| 1-133369 | 5/1989 | Japan | 357/23.7 |

OTHER PUBLICATIONS

Kim et al., "Amorphous silicon thin-film transistors with two-layer gate insulator", 12-12-88, pp. 2079-2081 of Appl. Phys. Letter, 357*23.7.

Carnaru et al., "Short Communication-PbTe Thin Field Effect Transistor", R36-R38, 10-10-70, 357*23.7.

Primary Examiner—Andrew J. James
Assistant Examiner—Daniel Y. J. Kim
Attorney, Agent, or Firm—Frishauf, Holtz, Goodman & Woodward

[57] ABSTRACT

A memory device includes a memory element composed of a first thin film transistor having a memory function, and a select element composed of a second thin film transistor for selecting the memory element. A gate insulation film of the first thin film transistor has a charge storage function. A gate insulation film of the second thin film transistor does not have any charge storage function. If a plurality of the memory devices are arranged in matrix form, this configuration can be used as E$^2$PROM. By forming the first and second thin film transistors simultaneously, it is possible to form the first and second thin film transistors easily in the simple manufacturing steps.

8 Claims, 13 Drawing Sheets

MEMORY DEVICE USING THIN FILM TRANSISTORS HAVING AN INSULATION FILM WITH SIN COMPOSITION RATIO OF 0.85 TO 1.1

BACKGROUND OF THE INVENTION

1. Field of the Invention

The present invention relates to a memory device using thin film transistors having a memory function and a method for manufacturing the same.

2. Description of the Related Art

A thin film transistor (TFT) is composed of a multilevel structure having a gate electrode, a gate insulating film, a semiconductor layer and source and drain electrodes. A staggered, inverted staggered, coplanar, and inverted coplanar type are known for thin film transistors.

The conventional thin film transistor has no memory function. It is not known that the thin film transistor is used for a memory element. If thin film transistors are used for the memory element, then they will be proved useful.

SUMMARY OF THE INVENTION

It is accordingly the object of the present invention to provide a memory device having thin film transistors acting as a memory and select transistors acting as a select transistor and a method for manufacturing the same.

According to one aspect of the present invention there is provided a memory device which includes:

a memory element (T21) composed of plurality of thin film transistors and a select thin film transistor (T22), connected to the memory element, for selecting the memory element, and said memory element comprising:
a semiconductor layer (23-1);
source and drain electrodes (S21, D21) electrically connected to the semiconductor layer;
a gate electrode (G21) for controlling formation of a channel of the semiconductor layer; and
first insulating film means (22A) for insulating the gate electrode and semiconductor layer from each other and imparting a hysteresis to a drain current-to-gate voltage relation; and said select thin transistor comprising:
a semiconductor layer (23-2);
source and drain electrodes (S22, D22) electrically connected to the semiconductor layer;
a gate electrode (G22) for controlling formation of a channel of the semiconductor layer; and
a second insulating means (22B) for insulating the gate electrode and semiconductor layer from each other and imparting a smaller hysteresis to a drain current-to-gate voltage relation of the select thin film transistor than that of said first insulating film means.

According to another aspect of the present invention there is provided a method for forming a first thin film transistor having a memory function and a second thin film transistor having no memory function, having (1) a step of forming a thin film transistor having a memory function, comprising
(a) forming a semiconductor layer (23-1):
(b) forming source and drain electrodes (S21, D21);
(c) forming a gate electrode (G21); and
(d) forming a first insulating film means (22A) which insulates the gate electrode and semiconductor layer from each other and imparts a hysteresis to a drain current-to-gate voltage relation of the transistor, and (2) a step of forming a thin film transistor no memory function, comprising
(a) forming a semiconductor layer (23-2);
(b) forming source and drain electrodes (S22, D22);
(c) forming a gate electrode (G22); and
(d) forming a second insulating means (22B) which insulates the gate electrode and semiconductor layer from each other and imparts a smaller hysteresis to a drain-current-to-gate voltage relation of this transistor than that of said select film transistor.

By doing so, a memory element can be composed of thin film transistors according to the present invention. The memory element can be composed of select transistors for selecting the memory element and a transistor having no memory function, that is, a transistor which has an excellent switching transistor. Therefore, the memory device of the present invention can be used as an $E^2PROM$ and constitutes a novel element which is different from an $E^2PROM$ which is generally so called.

DETAILED DESCRIPTION OF THE PREFERRED EMBODIMENTS

Embodiments of the present invention will be explained in more detail below. First memory device composed of thin film transistors of the present invention will be explained below.

FIGS. 1A to 1D show the VG-ID characteristic (a relation of a drain current ID to gate voltage VG) of a 2000 angstrom-thick gate insulating thin film (SiN film) type transistor which is measured with a varying Si/N composition ratio of the gate insulating film 2.

Figure 1A:
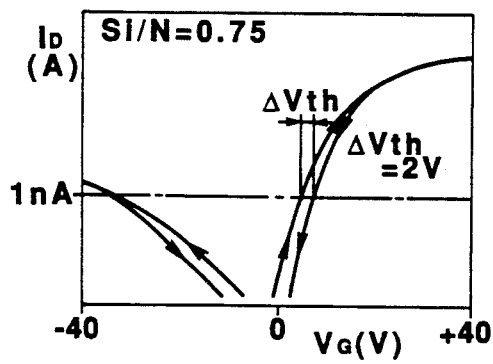
FIGS. 1A to 1D are graphs for explaining a hysteresis for a gate voltage-to-drain current relation of thin film transistors.
Figure 1C:
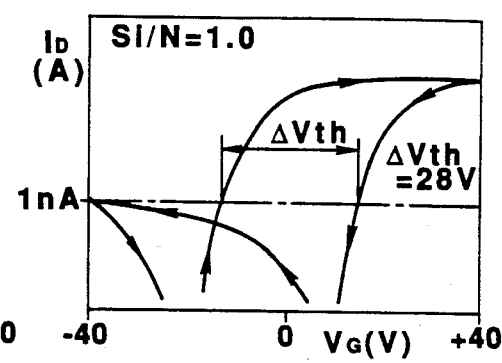
Figure 1B:
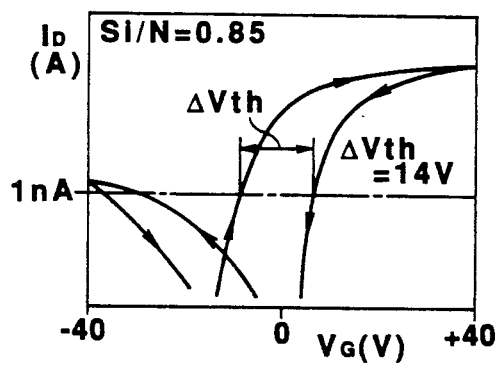

FIG. 1A shows the VG-ID characteristic at Si/N=0.75, an Si/N composition ratio of a gate insulating film $Si_3N_4$ of a conventional thin film transistor; FIG. 1B the VG-ID characteristic at Si/N=0.85; FIG. 1C the VG-VD characteristic at Si/N=1.0 and FIG. 1D the VG-VD characteristic at Si/N=1.1.

FIGS. 1A to 1D show a variation of a drain current ID (a source-to-drain channel current) measured against that of a gate voltage VG in which case a drain voltage VD is 10 V.

As appreciated from FIGS. 1A to 1D, the thin film transistor with the SiN film (Si:N=0.75) used as the gate insulating film has the VG-ID characteristic revealing almost no hysteresis, that is, the size delta Vth of the hysteresis is small.

Figure 1D:
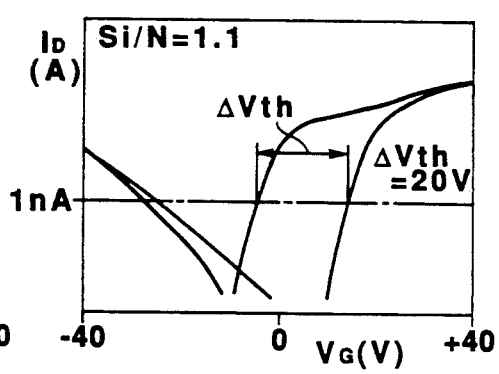

On the other hand, the thin film transistor for memory which uses an SiN film (Si:N=0.85 to 1.1) as a gate insulating film has the VG-ID characteristic which reveals a greater hysteresis as seen from FIG. 1B to 1D, that is, the size delta Vth of the hysteresis is large.

In FIGS. 1A to 1D, the size delta Vth of the hysteresis is defined as a difference between a gate voltage VG at ID=1 nA at which the gate voltage VG gradually varies from a negative value to +40 V and a gate voltage VG at ID=1 nA at which the gate voltage VG gradually varies from +40 V to a negative value. In FIGS. 1A, 1B, 1C and 1D, delta Vth=2 V, delta Vth=14 V, delta Vth=28 v and delta Vth=20 V, respectively.

The fact that the VG-ID characteristic has a greater hysteresis size means that the thin film transistor has a memory function for storing charges in the gate insulating film. The thin film transistor with the gate insulating film used as an SiN film whose Si/N composition ratio is 0.85 to 1.1 can be employed, as a memory device capable of a storing/releasing charges, by controlling a voltage which is applied to the gate electrode. The thin film transistor for memory holds the effect of a voltage which is finally applied to the gate electrode. That is, thin film transistor for memory maintains storing state or releasing state as far as it does not receive any external electric effect. It is thus possible to utilize the thin film transistor as a memory device. The hysteresis size as set forth above may also be called as a "hysteresis width" or "memory width". The SiN film (gate insulating film), though being referred to as 2000 angstrom thick, may be within a range 1500 angstrom to 4000 angstrom, desirably within a range 2000 to 3000 angstrom (the thickness of a gate insulating film of an ordinary thin film transistor), provided that the aforementioned Si/N composition range needs to be selected within a narrower range for a thicker SiN film than the aforementioned SiN composition range Si/N=0.85 to 1.1 to the aforementioned 2000 angstrom-thick SiN film.

It is considered that first data can be written into the thin film transistor by applying a first voltage to the gate insulating film of that transistor whose VG-ID characteristic is shown, for example, in FIGS. 1B to 1D, and second data different from the first data can be written into the transistor by applying a second voltage opposite in polarity to the first electrode to the gate insulating film of the transistor. The readout of data which is stored in the thin film transistor can be achieved utilizing the phenomenon that the level of a current through a channel of the thin film transistor varies depending upon a variation of voltage applied to the gate insulating film.

By experiments conducted, the following are used as the gate insulating film for imparting a memory function to the thin film transistor:

(1) A silicon nitride film having an Si/N composition ratio ranging from 0.85 to 1.1 and a thickness ranging from 1000 to 3000 angstrom;

(2) A multilayer film comprised of a silicon nitride film having an Si/N composition ratio ranging from 0.85 to 1.1 and an Si/N composition ratio ranging from 0.7 to 0.8;

(3) A multilayer film having a silicon nitride film and a high dielectric film;

(4) A multilayer film composed of an insulating film and a semiconductor layer; and (5) A silicon nitride film having a varying SiN composition ratio in a thickness direction and an area having an at least composition ratio of 1.0.

If the memory elements, comprised of such thin transistors, are employed as a memory device, the thin film transistors for memory are arranged as a matrix in which case any memory element needs to be selectively accessed. For that purpose, various transistors need to be prepared, such as thin transistors for memory, thin film transistors for selecting the memory element, and those transistors for providing decoders and sense amplifiers. As those transistors for a select purpose, etc., transistors having VG-ID characteristics revealing no hysteresis or a smaller hysteresis are employed.

A memory element will now be explained below which includes thin film transistors for memory having a VG-ID characteristic revealing a hysteresis and thin film transistors for select having a VG-ID characteristic revealing no hysteresis.

As will be explained below, the term "a gate insulating film having a hysteresis characteristic" means a gate insulating film which imparts the hysteresis to the VG-ID characteristic of the thin film transistor. For ease in distinguishing between the insulating film having the hysteresis characteristic and that not having any hysteresis characteristic, the latter insulating film is indicated by dots in associated figures.

First Embodiment

Figure 2:
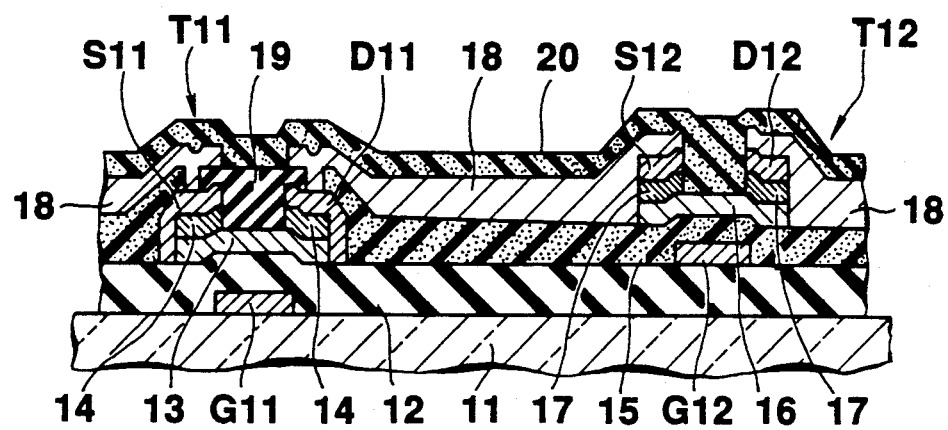
FIG. 2 is a cross-sectional view showing a memory device according to a first embodiment of the present invention.

FIG. 2 is a cross-sectional view showing a memory element according to a first embodiment of the present invention. The memory element of FIG. 2 comprises an insulating substrate 11, a thin film transistor T11 for memory which is formed over the insulating substrate 11, and a thin film transistor T12 for select. The thin film transistor T11 for memory comprises a gate electrode G11 formed on a substrate 11, a gate insulating film 12 formed on the gate electrode G11 and having a hysteresis characteristic, a semiconductor layer 13 composed of an i (intrinsic)-a (amorphous)-silicon (polysilicon or single crystal silicon) formed over the gate insulating film 12, an n+ (n type high impurity)-a-silicon (polysilicon or single crystal silicon) contact layer 14 formed on the semiconductor layer 13, and source electrode S11 and drain electrode D11 both of which are formed on the contact layer 14.

The thin film transistor T12 for select comprises a gate electrode G12 formed on a gate insulating film 12 of the thin film transistor T11, a gate insulating film formed on the gate electrode G12 and having no hysteresis characteristic, an i-a-silicon (polysilicon or single crystal silicon) semiconductor layer 16 formed on the gate insulating layer 15, an n+-a-silicon contact layer 17 formed on the semiconductor layer 16, and a source electrode S12 and drain electrode D12 which are formed on the contact layer 16.

The thin film transistor T12 has its source electrode S12 connected by a wiring layer 18 to the drain electrode D11 in the thin film transistor T11. A channel area of the thin film transistor T11 is covered with a protective film 19 which has no hysteresis characteristic. The gate insulating film 15 is etched away at an area corresponding to a location of the thin film transistor T11.

The thin film transistors T11 and T12 are covered with a protective film 20 which is formed of SiN having no hysteresis characteristic.

The method for manufacturing a memory element as shown in FIG. 2 will be explained below.

A metal film is formed on a substrate 11 and pattern to form a gate electrode G11. An insulating film with a hysteresis characteristic is formed on the resultant structure. The insulting film may be made of a silicon nitride film having a Si/N composition ratio of 0.8 to 1.1 and a thickness of 1000 to 3000 angstrom. An i-a-silicon (polysilicon or single crystal silicon) film and an n+-a-silicon (polysilicon or single crystal silicon) film are sequentially formed on the insulating film. These films are patterned to form a semiconductor layer 13 and contact layer 14. A metal film is formed on the resultant structure and patterned to form a source electrode S11 and drain electrode D11. The contact layer 14 is removed at an area situated over a channel area. Then a protective film 19 is formed. It is thus possible to form a thin film transistor T11 for memory.

A metal layer is formed on the insulating film 12 and patterned to provide a gate electrode G12. An insulating film with no hysteresis characteristic is formed on the resultant structure. The insulating film may be made of, for example, a silicon nitride film having an Si/N composition ratio of about 0.75. An i-a-silicon film and an n+-a-silicon film are sequentially formed on the insulating film. These two layers are patterned to provide a semiconductor layer 16 and contact layer 17. A metal film is formed on the resultant structure and patterned to form a source electrode S12 and drain electrode D12. The contact layer 17 is removed at an area situated over a channel area. It is thus possible to form a thin film transistor T12 for select.

A metal layer is formed on the resultant structure and patterned to provide a wiring layer 18. Then a protective film 20 is formed on the resultant structure.

In the first embodiment, the thin film transistors T11 and T12 are formed at a separate step because the gate insulating film 12 for the thin transistor T11 needs to be formed to have a hysteresis characteristic and because the insulating film 15 of the thin film transistor 12 is formed to have no hysteresis characteristic.

Second Embodiment

In the aforementioned first embodiment, the thin transistors T11 and T12 are manufactured in the separated step. A greater number of steps are thus required in the manufacture of the transistors. In the first embodiment, the thin film transistor T12 is formed on the gate insulating film 12. For this reason, the thin film transistor T12 rises further than the thin film transistor T11, resulting in a wholly thickened memory element structure.

The second embodiment is manufactured in less manufacturing steps and a memory element thus manufactured has a relatively thin structure as a whole.

Figure 3A:
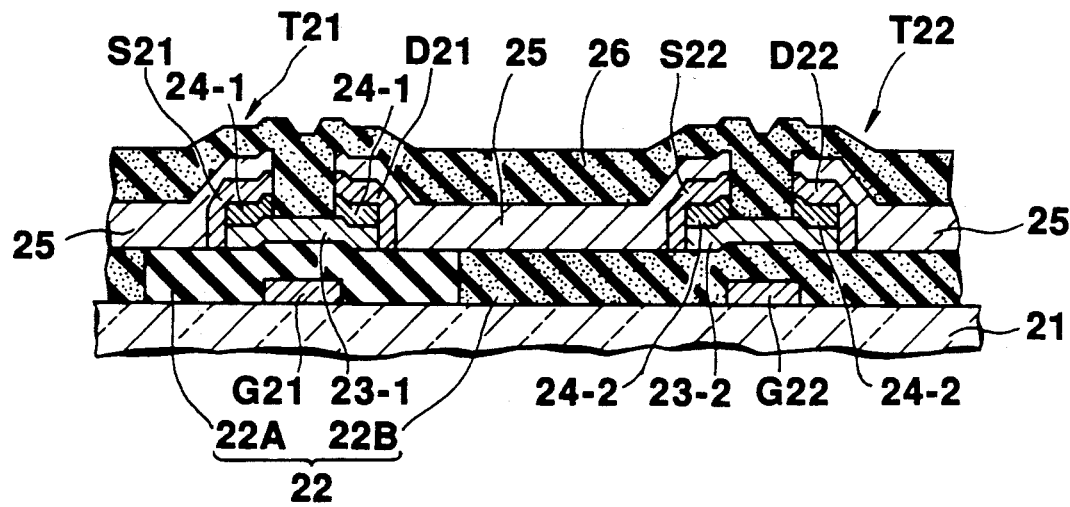
FIG. 3A is a cross-sectional view showing a memory device arrangement according to a second embodiment of the present invention and FIG. 3B is a plan view showing a major section of the memory device shown in FIG. 3A.
Figure 3B:
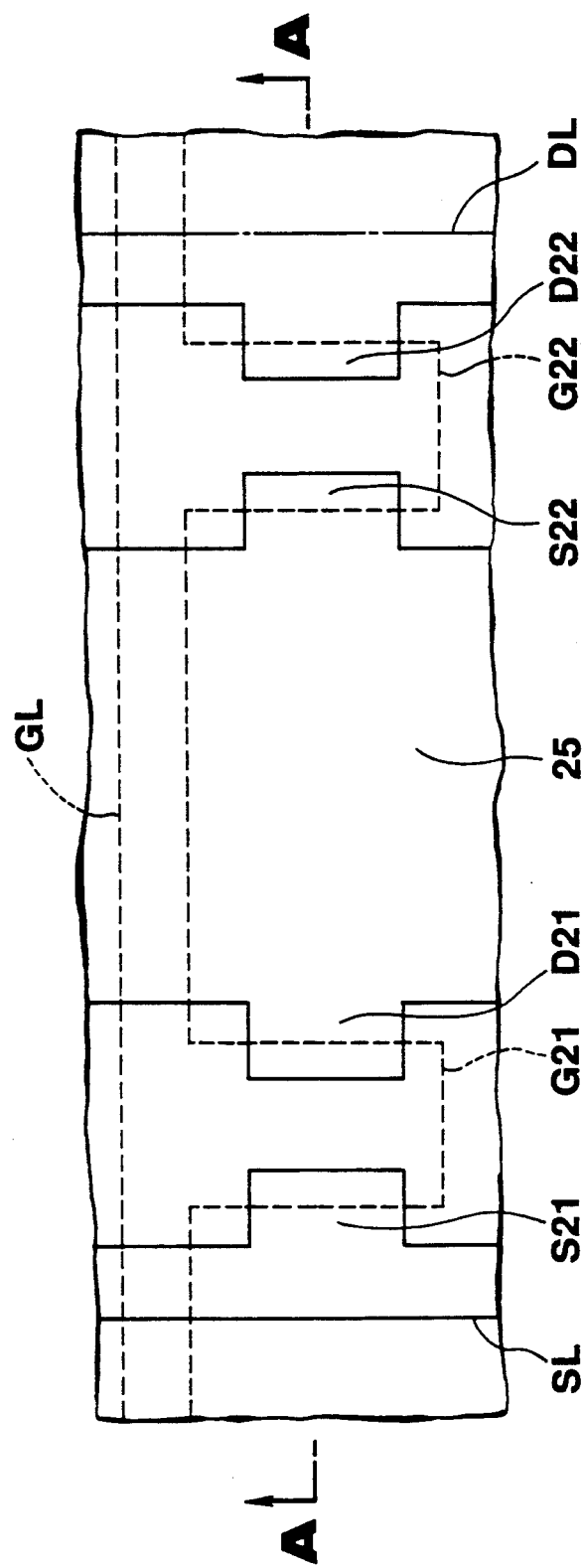

The second embodiment will be explained below by referring to FIGS. 3A and 3B and 4A to 4D. FIG. 3A shows a cross-section as taken along line A—A in FIG. 3B. FIG. 3B shows main portions so as to clarify a positional relation among respective associated parts.

The structure of the memory element as shown in FIGS. 3A and 3B will be explained below.

The memory element comprises an insulating substrate 21 and a thin film transistor T21 for memory and thin film transistor T22 for select, both of which are formed on the insulating substrate. Stated in more detail, gate electrodes G21 and G22 are formed on the insulating substrate 21. A gate insulating film 22 is formed on gate electrodes G21 and G22. Semiconductor layers 23-1 and 23-2 of an i (intrinsic)-a (amorphous)-silicon (single crystal or polysilicon) are formed on the gate insulating film 22 in a manner to oppositely face the gate electrodes G21 and G22, respectively. Contact layers 24-1 and 24-2 of n+ (n type high concentration)-a-silicon (polysilicon or single crystal silicon) are formed on the semiconductor layers 23-1 and 23-2, respectively. A source electrode S21 and drain electrode D21 and a source electrode S22 and drain electrode D22 are formed on the contact layers 24-1 and 24-2, respectively. The drain electrode D21 of the thin film transistor T21 and source electrode S22 of the thin film transistor T22 are connected to each other by a wiring layer 25. The source electrode S21 and drain electrode D22 are connected to a source line SL and drain line DL, respectively. The drain electrode D21 is connected to the source electrode S22 through the wiring layer 25. The thin film transistors T21 and T22 are covered with a protective film 26 of a silicon nitride, such as $Si_3N_4$, having no hysteresis characteristic.

The gate insulating film 22 is shared by both the thin film transistors T21 and T22 as a common insulating film. The gate insulating film 22 is formed of an SiN film having a hysteresis characteristic, such as an SiN film whose Si/N composition ratio is 0.85 to 1.1. However, an area 22B of the gate insulating film 22 other than an area 22A for the thin film transistor T21 loses its hysteresis characteristic by an oxidizing or a nitriding step.

In the memory element of the second embodiment, the thin film transistors T21 and T22 share their gate insulating film 22 as a common insulating film. Of the insulating areas 22A and 22B of the insulating film 22, the area 22A has the hysteresis characteristic and the area 22B has no hysteresis characteristic. Thus the thin film transistor T21 for memory has the VG-ID characteristic revealing a hysteresis and the thin film transistor T22 has the VG-ID characteristic having no hysteresis.

The manufacture of the memory element as shown in FIGS. 3A and 3B will be explained below with reference to FIGS. 4A to 4D.

A conductive film such as a metal is formed on an insulating substrate 21 to a thickness of about 1000 angstrom. The conductive film is patterned to provide gate electrodes G21 and G22. An SiN film is formed by a plasma CVD method on the substrate 21. The CVD step is performed by selecting an SiH$_4$ (a main component gas)/NH$_3$ flow ratio so as to form an SiN film whose composition ratio Si/N is 0.85 to 1.1. The gate insulating film 22 thus formed has a hysteresis characteristic. A structure as shown in FIG. 4A is obtained by the afore mentioned steps.

The area 22A of the gate insulating film 22 corresponding to the thin film transistor for memory is masked with a resist mask 27. The exposed portion of the gate insulating film 22 is oxidized or nitrided by, for example, a plasma oxidation method or a plasma nitriding method. By the oxidation method, the area 22 of the gate insulating film 22 has a composition SiON, losing its hysteresis characteristic. By the nitriding method, the area 22B of the gate insulating film 22 has a smaller Si/N composition ratio and loses its hysteresis characteristic. A structure as shown in FIG. 4B is obtained by the aforementioned steps.

A resist mask 27 is removed from the resultant structure. An i-a-silicon (single crystal or polysilicon) film and n+-a-silicon (single crystal or polysilicon) film are sequentially formed on the gate insulating film 22 and patterned to provide semiconductor layers 23-1 and 23-2 and contact layers 24-1 and 24-2. A metal film is deposited by, for example, an evaporation or a sputtering method on the resultant structure and patterned to provide source electrodes S21 and S22 and drain electrodes D21 and D22. Those areas of the contact layers 24-1 and 24-2 situated over channel areas are removed from the resultant structure. By these steps it is possible to obtain a thin film transistor T21 for memory and thin film transistor T22 for select, as shown in FIG. 4C.

Figure 4:
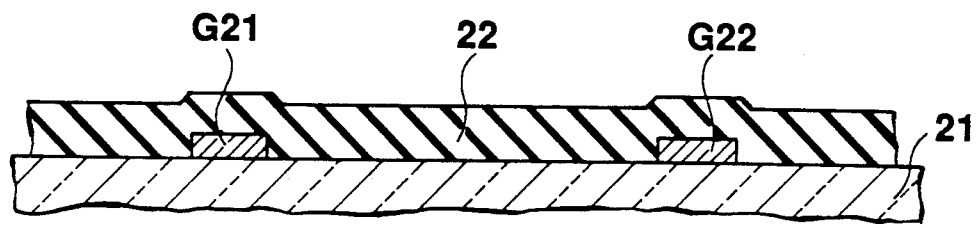
FIGS. 4A to 4D are cross-sectional views showing the manufacturing steps of the memory devices of FIGS. 3A and 3B.
Figure 4:
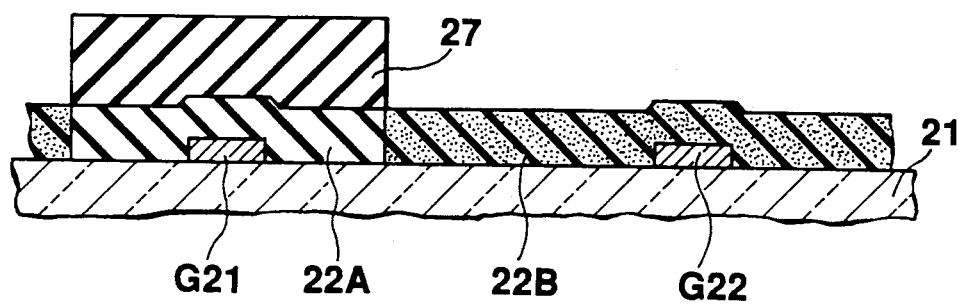
Figure 4:
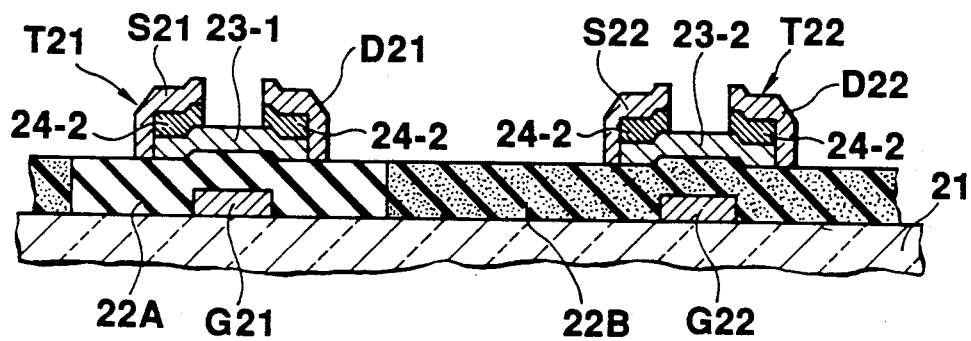
Figure 4:
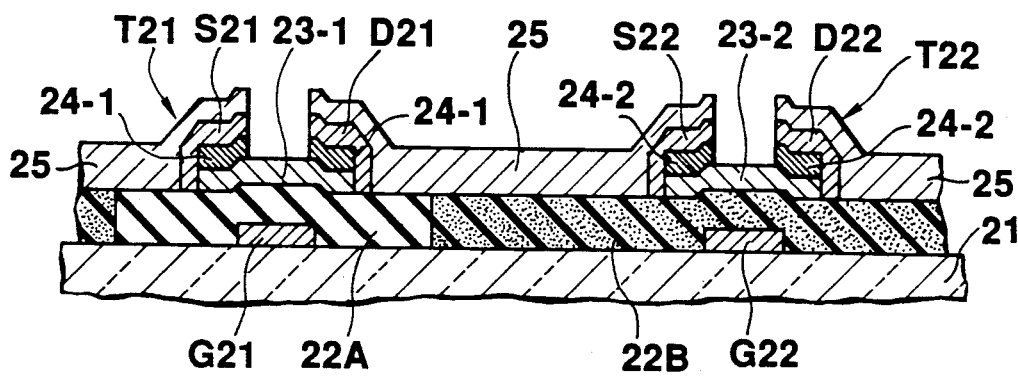

A metal film is formed on the resultant structure and patterned to provide a source line SL, drain line DL and wiring layer 25, as shown in FIG. 4D. A protective film 26 of SiN having no hysteresis characteristic is formed on the resultant structure to provide a memory element as shown in FIG. 3.

In the formation of the source electrodes S21 and S22 and drain electrodes D21 and D22, the wiring layer 25 may also be formed of the aforemetioned metal film.

In the memory element of the second embodiment, the transistors T21 and T22 share their gate insulting film 22 as a common insulating film. Thus the layer structure of the second embodiment can be made thinner than that of the first embodiment. The structure of this memory element can ensure the formation of both the transistors by substantially the same manufacturing steps.

In the manufacture of the memory element of the second embodiment, an SiN film 22 having a hysteresis characteristic is formed, and then, the hysteresis characteristic of a select-transistor formation area of the gate insulating film 22 is removed. The gate electrodes G21 and G22, semiconductor layers 23-1 and 23-2, contact layers 24-1 and 24-2, and electrodes S21, S22, D21, D22 are formed in that order at the respective steps. It is thus possible to substantially simultaneously form the transistors T21 and T22.

Figure 5:
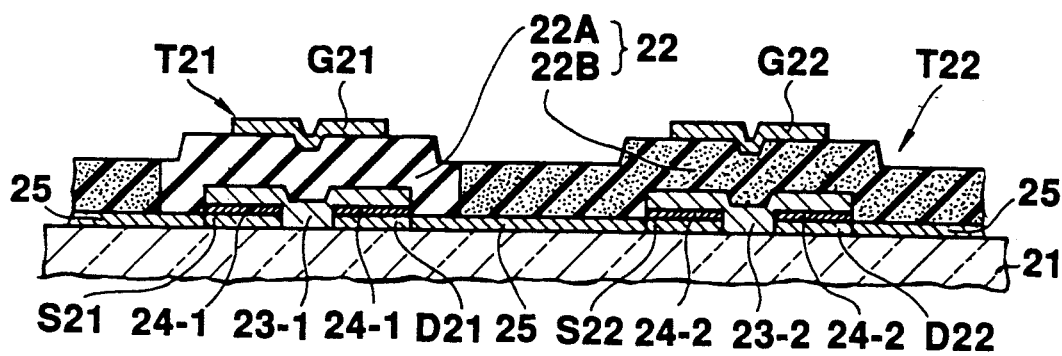
FIGS. 5 to 7 show modified forms of the device shown in FIGS. 3A and 3B.
Figure 6:
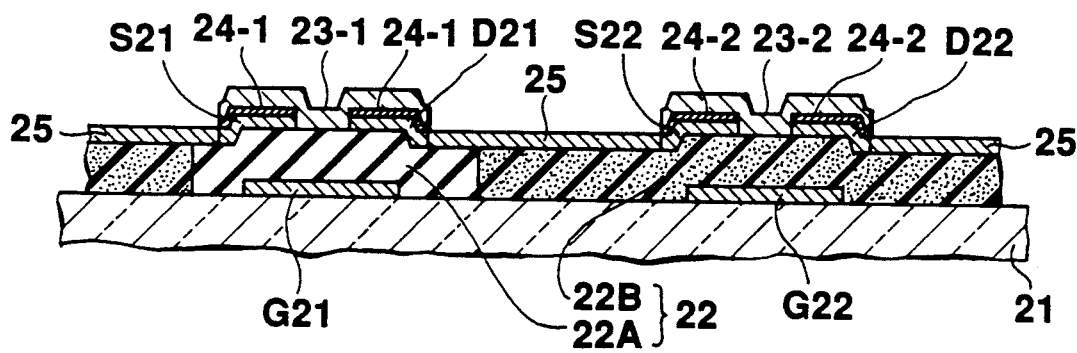
Figure 7:
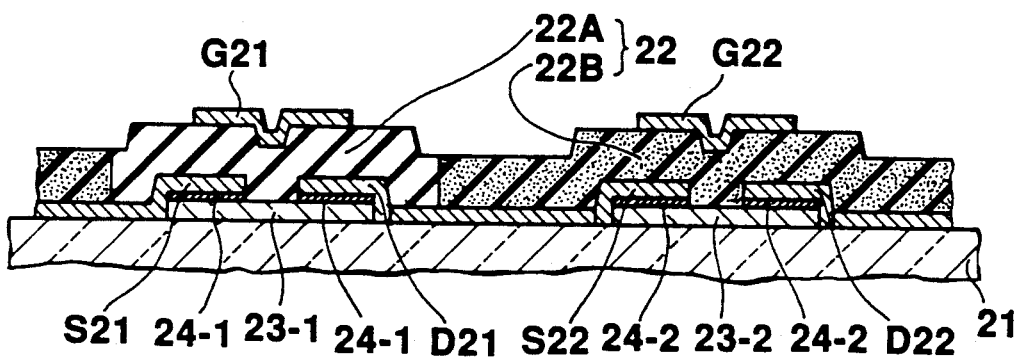

In the structure shown in FIG. 3A, the transistors T21 and T22 are of an inverted stagger type, but may be of a stagger, an inverted coplanar or a coplanar type. FIGS. 5, 6 and 7 show memory structures comprise stagger type thin film transistors, that of inverted coplanar type thin film transistors and that of coplanar type thin film transistors, respectively. In these Figures, identical reference numerals are employed to designate similar part or portion throughout. Therefore, any further explanation is omitted.

Even in FIGS. 5, 6 and 7, a thin film transistor for memory and thin film transistor for select share a gate insulating film 22 as a common insulating film in which case the hysteresis characteristic of a gate insulating film 22B is removed from the corresponding area of the gate insulating film 22. Even in this embodiment, it is possible to manufacture a memory element of a thin structure in less manufacturing steps.

The memory element shown in FIG. 5 can be manufactured by forming source and drain electrodes, a contact layer and semiconductor layer, gate insulating film, and gate electrode in that order.

The memory element shown in FIG. 6 can be manufactured by forming a gate electrode, gate insulating film, source and drain electrodes, contact layer and semiconductor layer in that order.

The memory element shown in FIG. 7 can be manufactured by forming a semiconductor layer, contact layer, source and drain electrodes, gate insulating film and gate electrode in that order.

Third Embodiment

A third embodiment of the present invention will be explained below by referring to FIGS. 8 and 9A to 9C.

Figure 8:
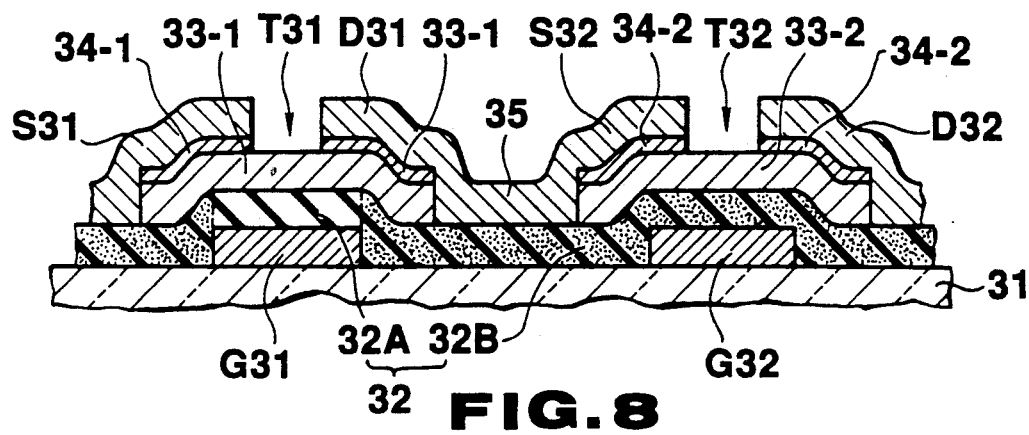
FIG. 8 shows a memory device according to a third embodiment of the present invention.

A memory element of a third embodiment will be explained below with reference to FIG. 8. As shown in FIG. 8, a gate electrode G31 for a thin film transistor T32 for memory and gate electrode G32 for a thin film transistor for select are formed on an insulating substrate 31 such as glass. A gate insulating film 32 is formed on the gate electrodes G31 and G32 and on the surface of the substrate. On the gate insulating film 32, semiconductor layers 33-1 and 33-2 of i-a-silicon are formed in a manner to oppositely face gate electrodes G31 and G32, respectively. Contact layers 34-1 and 34-2 of n+-a-silicon are formed on the semiconductor layers 33-1 and 33-2, respectively. A source electrode S31 and drain electrode D31 and a source electrode D32 and drain electrode D32 are formed on the contact layers 34-1 and 34-2, respectively. The thin film transistor T21 for memory is connected by a wiring layer 35 to the thin film transistor T32 for select.

The basic structure shown in FIG. 8 is the same as that shown in FIG. 3A. However, the gate insulating film 32 is different from the gate insulating film 22, because the film 32 is formed of an SiN film having no hysteresis characteristic. The gate insulating film 32 is formed of an SiN film whose Si/N composition ratio is made substantially equal in value to a stoichiometric ratio (Si/N=0.75). A silicon ion is implanted into a thin film transistor for memory formation area of the gate insulating film 32 to make the value of Si/N ratio greater than that of the stoichiometric ratio in which case Si/N=0.85 to 1.1. Thus the gate insulating film 32 has an area 32A having a hysteresis characteristic and an area 32B having no hysteresis characteristic.

Figure 9A:
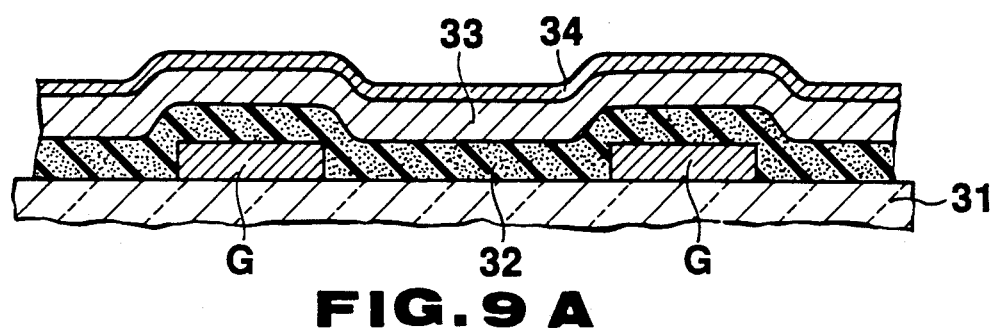
FIGS. 9A to 9C are cross-sectional views showing memory device of FIG. 8.
Figure 9B:
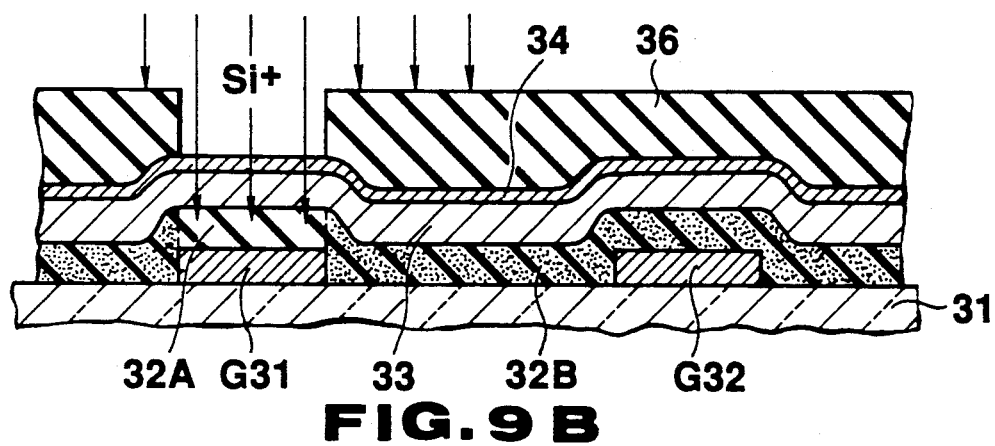
Figure 9C:
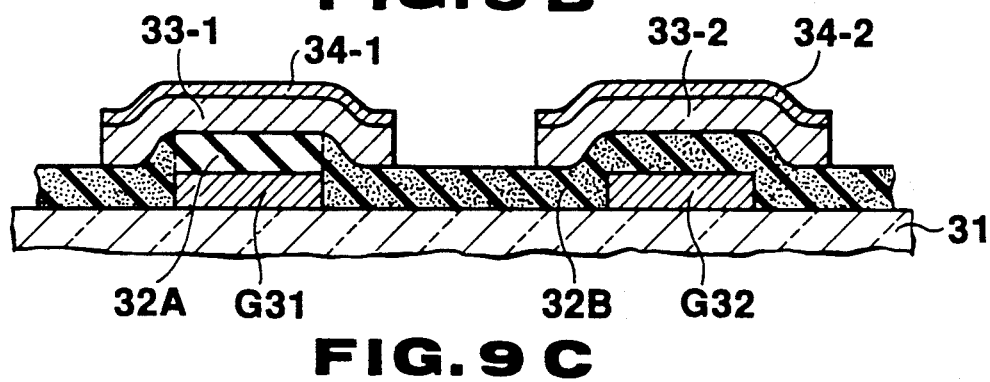

The manufacture of the memory element of the third embodiment will be explained below with respect to FIGS. 9A to 9C.

A metal film is formed on an insulating substrate 31 and patterned to form gate electrodes G31 and G32. An SiN film 32 is formed by, for example, a plasma CVD method on the resultant structure. The CVD step is carried out so that the Si/N composition ratio of the SiN film 32 may be nearly 0.75. A semiconductor layer 33 and n+-a-silicon layer 34 are sequentially formed on the SiN film 32 by means of, for example, the plasma CVD. If the SiN film 32 and semiconductor layer 33 are sequentially formed in a high vacuum atmosphere, provide a better i-a-Si to SiN interface. It is thus possible to obtain thin film transistors T1 and T2 having a stable characteristic.

A resist mask 36 is formed over the n+-a-silicon layer 34 and has an opening over the memory element area 32A. Through the opening, Si ions (Si+) are implanted into an area 32A of the gate insulating film 32. The ion implantation step is conducted by controlling acceleration voltage so that the peak of an Si-ion range is located within the gate insulating film 32. The dose of the ion is set such that the Si/N composition ratio of the area 32B is nearly 0.8 to 1.1. By doing so, a hysteresis characteristic is imparted to the area 32A enough adequate to allow the thin film transistor T31 to perform a memory function. The structure as shown in FIG. 9B can be obtained by carrying out the aforementioned steps.

The resist mask 36 is removed from the resultant structure. The n+-a-silicon layer 34 and semiconductor layer 33 are patterned to provide semiconductor layers 33-1 and 33-2 and contact layers 34-1 and 34-2.

A metal film is deposited on the resultant structure and patterned to provide source electrodes S31 and S32 and drain electrodes D31 and D32. The portions of the contact layers 34-1 and 34-2 situated over the channel areas are etched away by the etching step.

The memory element as shown in FIG. 8 is completed by the aforementioned steps.

The thin film transistors T31 and T32 in the third embodiment share their gate insulting film 32 as a common insulting film. The memory element of the third embodiment, like that of the second embodiment, can be made thinner as a whole than that of the first embodiment. It is possible to manufacture the thin film transistors for memory and select by substantially the same steps. According to the third embodiment, the thin film transistors T31 and T32 can be efficiently manufactured in less manufacturing steps than those of the first embodiment.

In the third embodiment, subsequent to forming the semiconductor layer 33 and contact layer 34, Si ions are implanted into the memory device formation area 32A of the gate insulating film 32. It may be possible to do, subsequent to forming a gate insulating film 32, that is, prior to forming the gate insulating film 32, implant silicon ions into the area 32A.

Although, in the third embodiment, the thin film transistors T31 and T32 are made of an inverted stagger type, they may be of a stagger, coplanar and inverted coplanar type. In these types, the thin film transistors T1 and T2 can simultaneously be formed if their transistors is so formed as to share the gate insulating film as a common insulating film. The memory element composed of staggered type thin film transistors can be fabricated by forming source and drain electrodes, a contact layer and a semiconductor layer, a gate insulating film and a gate electrode in that order. The memory element composed of coplanar type thin film transistors can be manufactured by forming a semiconductor layer and a contact layer, source and drain electrodes, a gate insulating film and a gate electrode. The memory element composed of inverted coplanar type thin film transistors can be fabricated by forming a gate electrode, a gate insulating layer, source and drain electrodes, a contact layer and semiconductor layer in that order.

Fourth Embodiment

A fourth embodiment of the present invention will be explained below by referring to FIGS. 10 and 11A to 11D.

A memory element of the fourth embodiment will be explained below with reference to FIG. 10.

Gate electrodes G41 and G42 of thin film transistors T41 for memory and T42 for select, are formed on an insulating substrate 41. A high breakdown voltage dielectric layer 42 composed of TaOx (tantalum oxide) is formed on the substrate and gate electrodes G41 and G42. A gate insulating film 43 composed of SiN is formed on the dielectric layer 42. An intrinsic silicon semiconductor layer 44-1 is formed on a thin film transistor T41 for memory formation area of the gate insulating film 43 in a manner to be located opposite to the gate electrode G41. An intrinsic silicon semiconductor layer 44-2 is formed on a thin film transistor T41 for select formation area of the gate insulating film 44-2. A source electrode S41 and drain electrode D41 and source electrode S42 and drain electrode D42 are formed on the semiconductor layers 44-1 and 44-2, respectively. The drain electrode D41 of the thin film transistor T41 for memory is connected by a wiring layer, not shown, to the source electrode S42 of the thin film transistor T42 for select. The thin film transistors T41 and T42 are covered with a protective film 45.

The gate insulating film 43 is shared by the thin film transistors T41 and T42 as a common insulating film. The gate insulating film 43 is so formed that its are corresponding to the transistor T41 is thinner than the other area corresponding to the transistor T42. Stated in more detail, the gate insulating film 43 comprises a first SiN film 43A formed relative to the thin film transistor T41 for select and second SiN film 43B formed relative to the transistor 41 and the transistor T42. The gate insulating film of the transistor T41 for memory is formed of the second SiN film 43B, and the gate insulting film of the transistor T42 for select is formed of a doublelayer structure composed of the first SiN film 43A and second SiN film 43B. The first and second SiN films 43A and 43B are made of the same material whose Si/N composition ratio is made substantially equal in value to a stoichiometric ratio in which case Si/N=0.75. The first SiN film 43A and second SiN film 43B are about 2000 angstrom and about 500 angstrom, respectively. That is, the gate insulating films of the thin film transistors T1 and T2 are about 500 angstrom and about 2500 angstrom, respectively.

The thin film transistor T41 for memory has a thinner gate insulating film which has no adequate breakdown voltage characteristic. The breakdown voltage of the gate insulting film 43 is compensated by the high breakdown voltage layer 42. $Ta_2O_5$ is ideal as a TaOx constituting the dielectric layer 42. The dielectric layer 42 is about 2000 angstrom thick.

Figure 12:
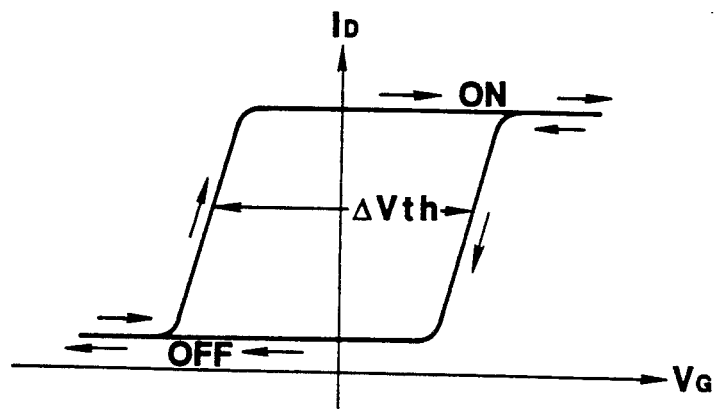
FIG. 12 is a graph showing a VG-ID characteristic of a memory device.
Figure 13:
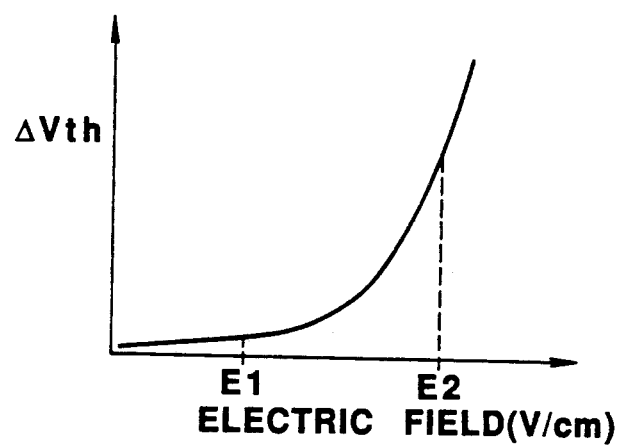
FIG. 13 is a graph showing a relation of a delta Vth to an electric field intensity.
Figure 14:
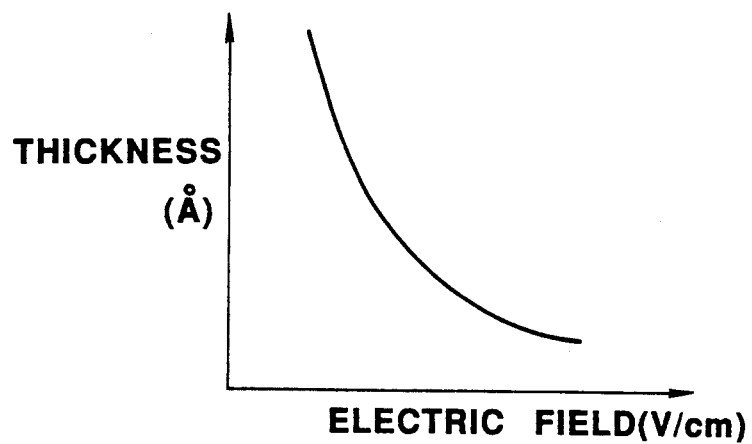
FIG. 14 is a graph showing a relation of the thickness of a gate insulating film to the intensity of an electric field.

The hysteresis characteristic of the thin film will be explained below. FIG. 12 shows the VG-ID characteristic of the thin film transistor. As the thin film transistor for memory it is necessary that it have a greater delta Vth. As the thin film transistor for select, there is a need for a transistor whose delta Vth is nearly "zero". The delta Vth of the thin film transistor is determined by the intensity of an electric field applied to the gate insulating film. FIG. 13 shows a relation of the intensity of an electric field in the gate insulating film (voltage per unit thickness) V/cm to delta Vth of the thin film transistor. As shown in FIG. 13, an increase in the intensity of an electric field leads to a rise in delta Vth. FIG. 14 shows a relation of the thickness of the gate insulating film to the intensity of an electric field, V/cm. As will be seen from FIG. 14, the intensity of the gate insulating film is in inverse proportion to the thickness of the gate insulating film. For a 2000 angstrom-thick $Ta_2O_5$ to be used as a dielectric material, the intensity of the electric field in the gate insulating film whose Si/N composition ratio is 0.75 is as small as E1 = 1 MV/cm for the film thickness of 2500 angstrom and as large as E2 = 3 MV/cm for the film thickness of 500 angstrom.

As appreciated from the above, even if the same material is used for the gate insulating film, the intensity of an electric field which governs the VG-ID characteristic of the thin film transistor can be varied by the thickness of the gate insulating film. The aforementioned intensity of the electric field is in inverse proportion to the thickness of the gate insulation film. Therefore, as shown in FIG. 10, the use of a different thickness for the gate insulating film of the transistor for memory and transistor for select can impart the VG-ID characteristic revealing almost no hysteresis curve to the transistor T42 for select and the VG-ID characteristic revealing an adequate hysteresis to the transistor T41 for memory.

The method for manufacturing a memory element will be explained below by referring to FIGS. 11A to 11D.

Figure 11A:
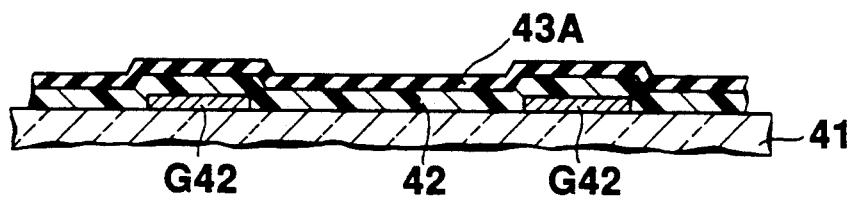
FIGS. 11A to 11D are cross-sectional views showing the manufacturing steps of the memory device of FIG. 10.

A metal film is formed on an insulating substrate 41 and patterned to substantially simultaneously form gate electrodes G41 and G42. An about 2000 angstrom-thick TaOx (desirably $Ta_2O_5$) is deposited by the plasma CVD method on the insulating substrate to provide a high breakdown voltage dielectric layer 42. Silicon nitride is deposited by the plasma CVD method on the dielectric layer 42 to a thickness of about 2000 angstrom to form a first SiN film 43A. The CVD step is conducted by selecting an $SiH_4$ to $NH_3$ flow ratio so that the Si/N value of the SiN film formed is nearly 0.75. A structure as shown in FIG. 11A is obtained by these steps.

Figure 11B:

A portion of the first SiN film 43a corresponding to the device area of the transistor T41 is cut away to expose a high breakdown voltage dielectric layer 42. The first SiN film 43A is left at a transistor T42 formation area. A structure as shown in FIG. 11B is obtained by the aforementioned steps.

Figure 11C:
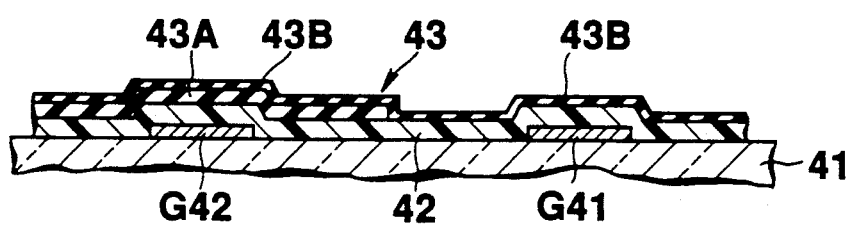

An about 500 angstrom-thick SiN is deposited by plasma CVD method on the first SiN film 43A and exposed high breakdown voltage dielectric layer 42. This CVD steps are performed under the same condition as that under which the formation of the first SiN film 43A is done. A gate insulating film 43 comprising the first SiN film 43A and second SiN film 43B is shared by the thin film transistors T42 and T41 as a common insulating film. A structure as shown in FIG. 11C is obtained by the aforementioned step.

Figure 11D:
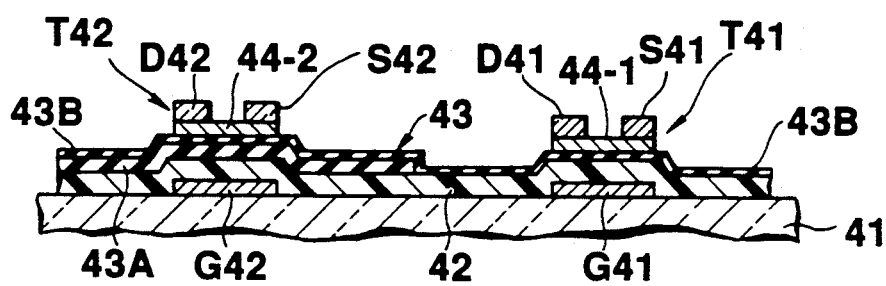

An intrinsic silicon is formed by the plasma CVD method on the gate insulating film 43 and patterned to simultaneously form semiconductor layers 44-1 and 44-2. A metal layer is formed on the resultant structure and patterned to provide source electrodes S41 and S42, drain electrodes D41 and D42 and a wiring layer connecting the source electrode S42 to the drain electrode D41. A structure as shown in FIG. 11D is obtained by the aforementioned step.

Figure 10:
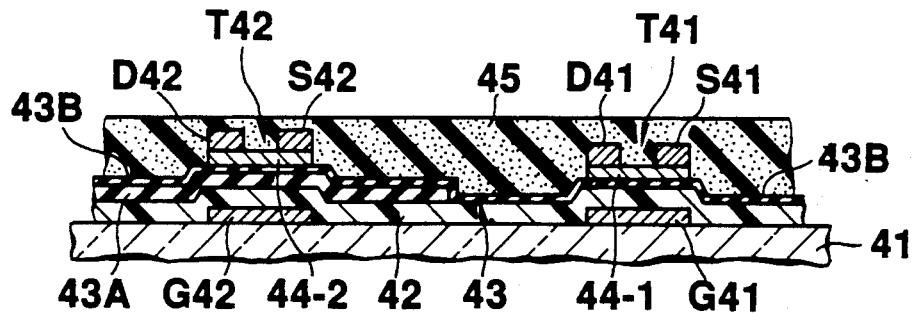
FIG. 10 is a cross-sectional view showing a memory device according to a fourth embodiment of the present invention.

A protective insulating film 45 is formed on the resultant structure, completing a memory element as shown in FIG. 10.

According to the fourth embodiment, a memory element structure can be manufactured, as a thinner unit, in less manufacturing steps in comparison with the case of the first embodiment. In the method for manufacturing a memory element of the fourth embodiment it is possible to substantially simultaneously form transistors T42 and T41 easily in the simpler steps.

The Si/N composition ratio of the gate insulating film 43 is not restricted to a value of its stoichiometric ratio, Si/N = 0.75. It is possible to, for example, make the Si/N composition ratio of the gate insulating film greater than 0.75. In this case, the gate insulating film of the element area of the transistor T41 and that of the transistor T42 are formed such that they are thicker than that of the gate insulating film of the aforementioned embodiment.

The high breakdown voltage dielectric layer 42 for compensating for the breakdown voltage of the gate insulating film may be formed at a thinner area alone of the gate insulating film 43, that is, the portion of the transistor T41. If the breakdown voltage of the gate insulating film can be ensured, it is not necessary to provide the high breakdown voltage dielectric layer 42.

In the aforementioned embodiment, the transistors T41 and T42 are of an inverted stagger type. Both the transistors may be of a stagger, a coplanar and an inverted coplanar type.

A memory element composed of stagger thin film transistors is fabricated by forming source and drain electrodes, a semiconductor layer, a gate insulating film, a high breakdown voltage dielectric layer and a gate electrode in that order. A memory element composed of coplanar type thin film transistors is manufactured by forming a semiconductor layer, source and drain electrodes, a gate insulating film, a high breakdown voltage dielectric layer and a gate electrode in that order. A memory element composed of inverted coplanar type thin film transistors is manufactured by forming a gate electrode, a high breakdown voltage dielectric layer, a gate insulating film, source and drain electrodes and semiconductor layer in that order.

The first and second SiN films 43A and 43B can be formed in that order or in reverse order.

In the aforementioned embodiment, the gate insulating film for the thin film transistor T42 for select is formed as a doublelayer structure. The gate insulating film 43 may wholly be formed as a single layer in which case an area for the thin film transistor T41 is made thinner by a half etching step than the rest of the gate insulating film.

Fifth Embodiment

A memory element according to a fifth embodiment of the present invention will be explained below by referring to FIGS. 15 and 16A to 16E.

Figure 15:
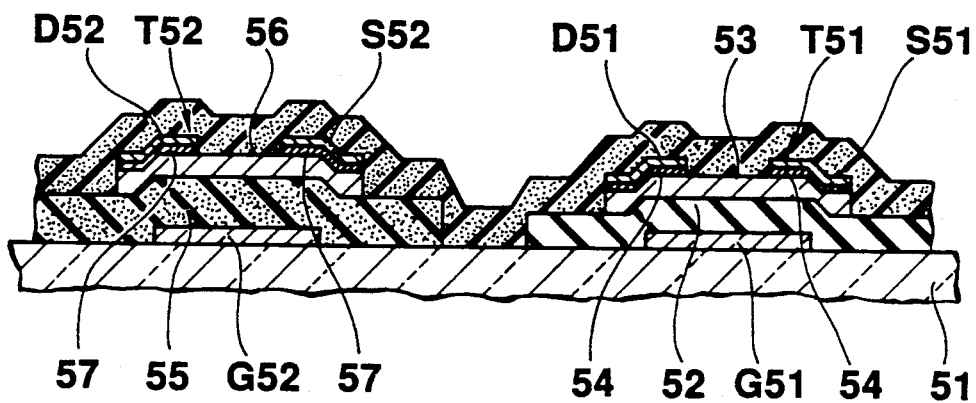
FIG. 15 is a cross-sectional view showing a memory device according to a fifth embodiment of FIGS. 16A to 16E.

FIG. 15 is a cross-sectional view showing a memory element according to a fifth embodiment of the present invention. The memory element comprises an insulating substrate 51 such as glass and a thin film transistor T51 for memory and thin film transistor T52 for select, both of which are formed on the insulating substrate.

The thin film transistor T51 comprises a gate electrode G51 formed on a substrate 51, a gate insulating film 52 of SiN which is formed on the gate electrode G51, a semiconductor layer 53 of i-a-silicon which is formed on the gate insulating film 52, a contact layer 54 of n+-a-silicon which is formed on the semiconductor layer 53, and source and drain electrodes S51 and D51. The gate insulating film 52 has a charge storage function and an Si/N composition ratio (Si/N=0.85 to 1.15) greater than its stoichiometric ratio (Si/N=0.75).

The thin film transistor T52 for select comprises a gate electrode G52 formed on the substrate 51, a gate insulating film 55 of SiN which is formed on the gate electrode G52, a semiconductor layer 56 of i-a-silicon which is formed on the gate insulating film 55, a semiconductor layer 56 of i-a-silicon formed on the gate insulating film 55, a contact layer 57 of n+-a-silicon which is formed on the semiconductor layer 57, and source and drain electrodes S52 and D52. The gate insulating film 55 has an Si/N composition ratio equal to the stoichiometric ratio (Si/N=0.75) and has no charge storage function.

The drain electrode D51 of the thin film transistor T51 is connected by a wiring layer, not shown, to the source electrode S52 of the thin film transistor T52. The thin film transistors T51 and T52 are covered with a protective film 59.

The method of manufacturing the memory element according to the present invention will be explained below by referring to FIGS. 16A to 16E.

Figure 16A:
FIGS. 16A to 16E are cross-sectional views showing a method for manufacturing a memory device of FIG. 15.

A metal film, such as chromium, is formed by a vacuum evaporation or sputtering method on an insulating substrate 51 to a thickness of 1000 angstrom and patterned to provide gate electrodes G51 and G52 and a gate wiring, not shown, connecting the gate electrode G51 to the gate electrode G52. A structure as shown in FIG. 16A is obtained by the aforementioned manufacturing steps.

Figure 16B:
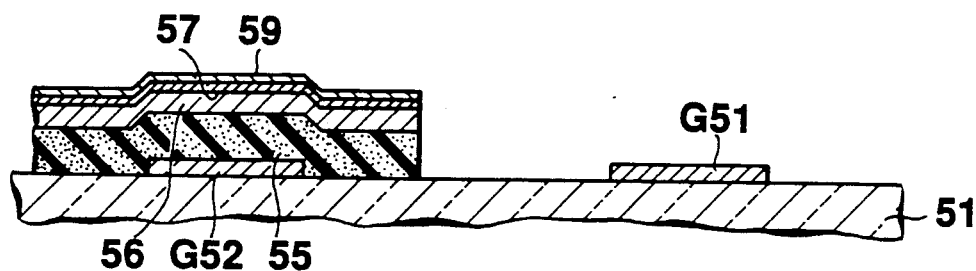

An insulating film of silicon nitride with an Si/N composition ratio substantially equal to its stoichiometric ratio (Si/N=0.75), an i-a-silicon layer, an n+-a-silicon layer and metal film, such as chromium, are sequentially formed by, for example, a plasma CVD, vacuum evaporation or sputtering method on the substrate to a thickness of 3000 angstrom, 1500 angstrom, 250 angstrom and 500 angstrom, respectively. The each layer and film is patterned by a photolithographic method, leaving a transistor T42 (transistor for select) formation area alone. A structure as shown in FIG. 16B is obtained by the aforementioned steps.

Figure 16C:
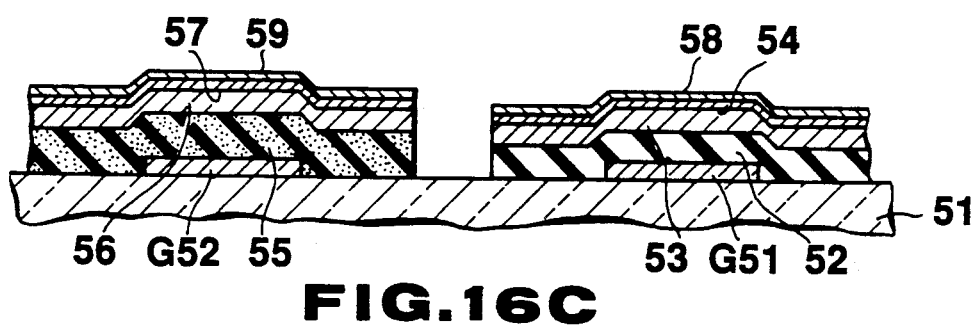

A silicon nitride layer whose Si/N composition ratio is 0.85 to 1.15, an i-a-silicon layer, an n+-a-silicon layer and a metal film are formed by a plasma CVD, vacuum evaporation or sputtering method on the resultant structure to a thickness of 2000 angstrom, 1500 angstrom, 250 angstrom and 500 angstrom, respectively. The each film and layer is patterned by a photolithographic method, leaving a transistor T41 (transistor for memory) formation area alone. A structure as shown in FIG. 16C is obtained by the aforementioned steps.

Figure 16D:
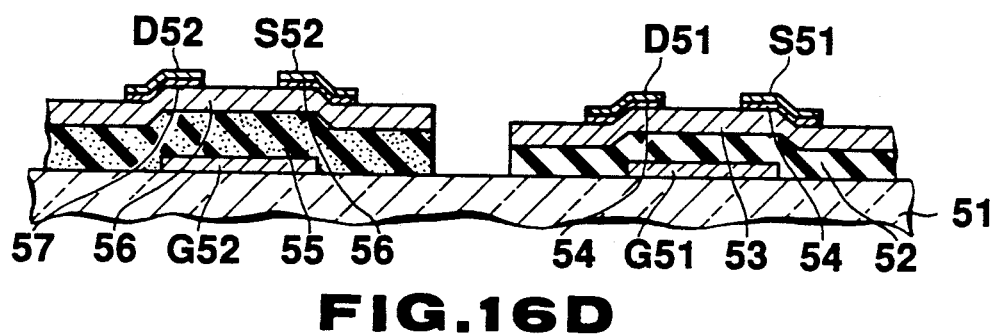

Metal films 58, 59 and n+ type semiconductor layers 54, 57 are patterned by the lithographic method to provide source electrodes S51, S52 and drain electrodes D51, D52, the source wiring layer connected to the source electrode S51 and the drain wiring layer connected to the drain electrode S52. The n+ type semiconductor layers 54, 57 are removed at other than those areas which are situated below the electrodes S51, D51, S52, D52 and wiring layer. A structure as shown in FIG. 16D is obtained by the aforementioned steps.

Figure 16E:
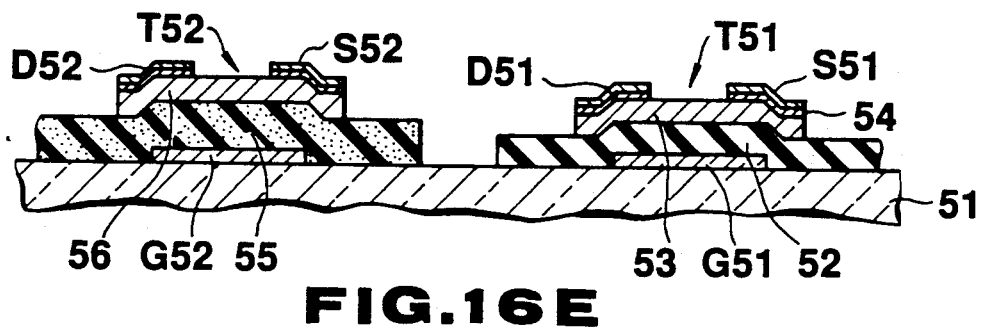

Then the semiconductor layers 53 and 56 are patterned by the photolithographic method to a transistor element pattern. The thin film transistors T51 and T52 as shown in FIG. 16E are thus completed by the aforementioned steps.

The wiring layer connecting the electrode D51 and the source electrode S52 is formed. Then a protective insulating film is formed on the resultant structure. A structure as shown in FIG. 15 is completed.

A multilayer structure comprising the gate insulating film 55, semiconductor layer 56, contact layer 57 and metal film 59 and a multilayer structure comprising the gate insulating film 52, semiconductor layer 53, contact layer 54 and metal film 58 are formed in that order and in reverse order.

In the method for manufacturing the memory element, a plurality of components are formed by a single patterning step. It is thus possible to manufacture such devices efficiently in less patterning steps.

The gate insulating film 52 having a charge storage function may be formed as a doublelayer structure such that a 1000 to 5000 angstrom-thick high dielectric film having a dielectric constant of bout 10 is formed on the gate electrode G51 and that a 50 angstrom to 2000 angstrom-thick silicon nitride film whose Si/N composition ratio is about 0.75 is formed on the semiconductor layer 53. The gate insulating film of such a doublelayer structure has an adequate charge function. Furthermore, the gate insulating film 52 may be of such a type that it has a charge storage function, that is, a hysteresis characteristic.

Although, in the aforementioned embodiment, the memory element has been explained as connecting the thin film transistor T51 to the thin film transistor T52, the present invention can also be applied to a memory element of such a type that a line select thin film transistor is connected to the wiring layers for the gate, source and drain electrode of the thin film transistor for memory so as to select these wiring layers.

Sixth Embodiment

A memory element according to a sixth embodiment of the present invention will be explained below by referring to FIGS. 17 and 18A to 18D.

A memory element of this embodiment will be explained below with reference to FIG. 17.

Figure 17:
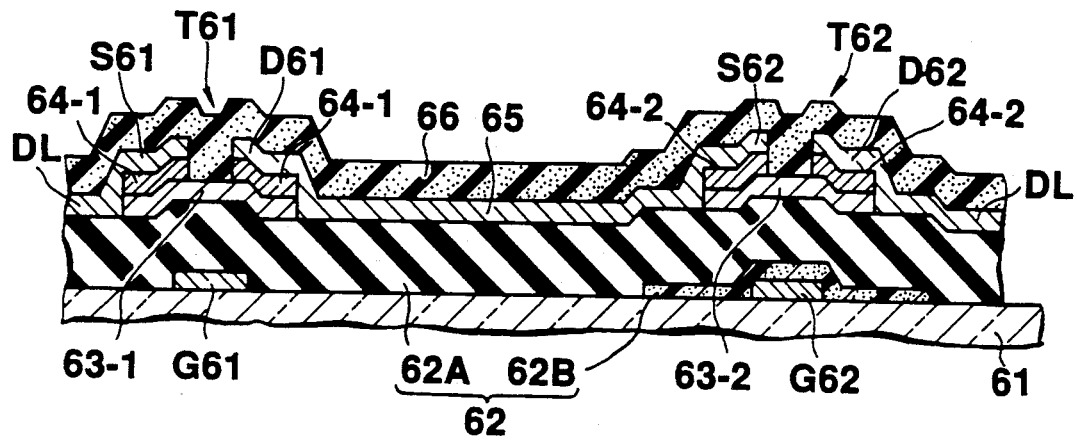
FIG. 17 is a cross-sectional view showing a memory device according to a sixth embodiment of the present invention.

In FIG. 17, a gate electrode G61 for a thin film transistor T61 for memory and gate electrode G62 for a thin film transistor T62 for select are formed on an insulating substrate 61. A gate insulating film 62 is formed on the gate electrodes G61 and G62. Semiconductor layers 63-1 and 63-2 of i-a-silicon are formed on the gate insulating film 62 in a manner to be situated opposite to the gate electrodes G61 and G62, respectively. Contact layers 64-1 and 64-2 of n+-a-silicon are formed on the semiconductor layers 63-1 and 63-2, respectively. A source electrode S61 and drain electrode D61 and a source electrode S62 and drain electrode D62 are formed on the contact layers 64-1 and 64-2. The drain electrode D61 for the thin film transistor T61 for memory and the source electrode S62 of the thin film transistor for select are connected to each other via a wiring layer 65 which is formed integral with both the electrodes D61 and S62. A source electrode S61 is connected to a source line SL integral therewith. The drain electrode D62 is connected to a drain line DL integral therewith. The wiring layer 65 and source line SL and drain line DL are formed on the gate insulating film 62. The gate electrode G61 and the gate electrode G62 are connected to a gate line not shown. The thin film transistors T61 and T62 are covered with a protective film 65.

The gate insulating film 62 comprises an insulating film 62A situated at element areas of the transistors T61 and T62 and a thin insulating film 63B situated between the gate electrode G62 and the gate insulating film 62A and having no hysteresis characteristic. The gate insulating film 62A is formed of silicon nitride having a hysteresis curve, such as silicon nitride whose Si/N composition ratio 0.85 to 1.15. The gate insulating film 62B is formed of silicon nitride or silicon oxide having no hysteresis, such as silicon nitride whose Si/N composition ratio is substantially equal to its stoichimetric ratio (Si/N=0.75).

Since the gate insulating film 62A has a hysteresis characteristic in the present memory element, the thin film transistor T61 can be employed as a memory device. The thin film transistor T62 has its hysteresis characteristic diminished by the gate insulating film 62B. The size of the hysteresis of the transistor T62 varies depending upon the thickness of the gate insulating film 62B. If the gate insulating film 62B is formed with a thickness with which the transistor T62 loses its hysteresis characteristic, a thin film transistor T62 can be formed having a better switching characteristic, not a hysteresis characteristic. Since the transistors T61 and T62 share their gate insulating film 62 as a common insulating film, it is possible to impart a desired function to the transistors T61 and T62.

The method for manufacturing a memory element will be explained below with respect to FIGS. 18A to 18D.

Figure 18A:
FIGS. 18A to 18D are cross-sectional views showing a method for manufacturing a memory device shown in FIG. 17.

A metal film, such as chromium, is deposited on an insulating substrate 61 and patterned to form gate electrodes G61, G62 and a gate line for connecting the gate electrode G61 to the gate electrode G62. A structure as shown in FIG. 18A is formed by these steps.

Figure 18B:
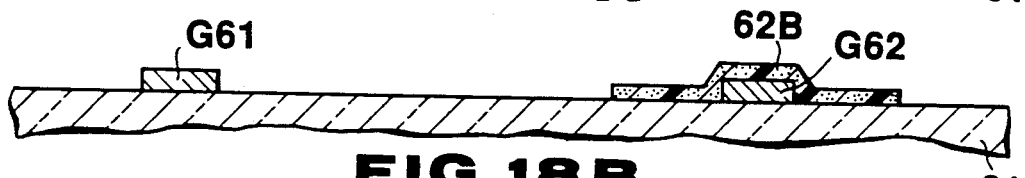

Silicon nitride whose Si/N composition ratio is substantially equal to its stoichiometric ratio (Si/N=0.75) is deposited by the plasma CVD method on the insulating substrate 61 and patterned by the photolithographic method to provide a silicon nitride film 62B on the gate electrode G62 as shown in FIG. 18B.

Figure 18C:
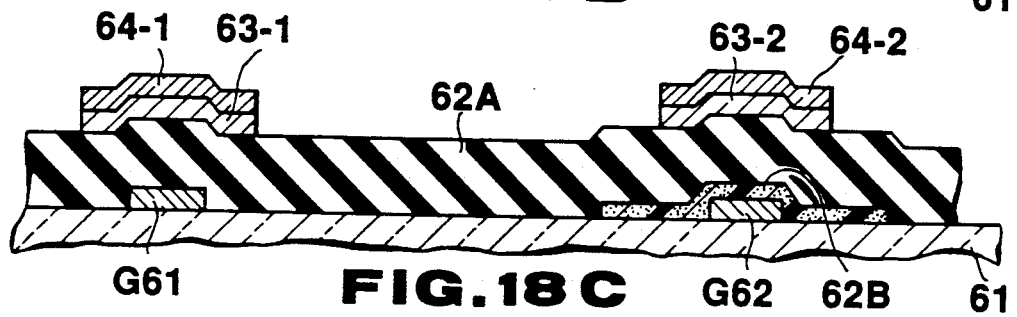

Silicon nitride whose Si/N composition ratio is 0.85 to 1.15 is deposited by the plasma CVD method on the resultant structure to form a gate insulating film 62A. An i-a-silicon layer and n+-a-silicon layer are sequentially formed by the plasma CVD method and patterned to provide semiconductor layers 63-1 and 63-2 and contact layers 64-1 and 64-2. A structure as shown in FIG. 18C is formed by these steps.

Figure 18D:
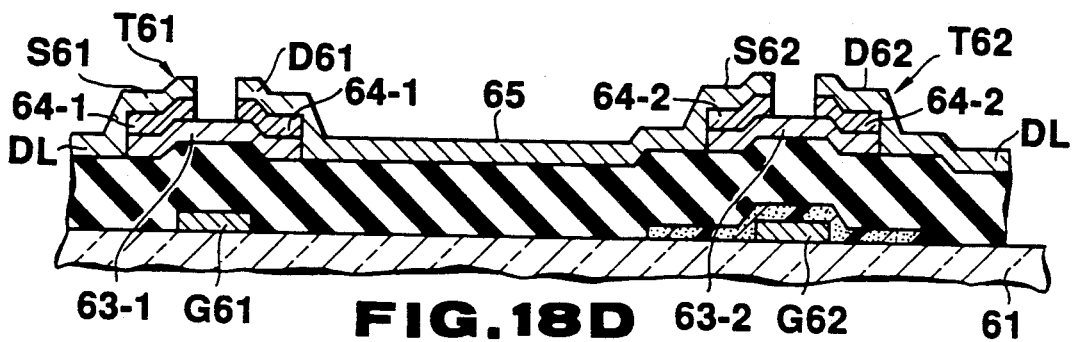

A metal film is deposited on the resultant structure and patterned to simultaneously form a source electrode S61 and drain electrode D61, a source electrode S62 and drain electrode D62, a wiring layer 65, a source line SL and drain electrode DL as shown in FIG. 18D. The contact layers 64-1 and 64-2 are etched away at an area which is situated over the channel area. By these steps, a thin film transistor T61 for memory and thin film transistor T62 for select are formed as shown in FIG. 18D.

An overlying protective film 67 is formed on the resultant structure to form the memory element as shown in FIG. 17.

In accordance with this embodiment, it is possible to substantially simultaneously form transistors T61 and T62 and hence to form the memory element efficiently in less manufacturing steps. Since the transistors T61 and T62 share their gate insulating film as a common insulating film, this memory element can wholly be made thinner than the memory element of the first embodiment.

The thin film transistors T61 and T62 can be formed substantially simultaneously in accordance with the aforementioned manufacturing method.

The wiring layer 65, source line SL and drain line DL in one group and a source electrode S61 and drain electrode D61 and source electrode S62 and drain electrode D62 in another group may be formed in a separate step.

Although, in the aforementioned embodiment, the thin film transistors have been explained as being of an inverted stagger type, they may be made a stagger type, a coplanar type or an inverted coplanar type. Even in this case, a thin film transistor for memory and thin film transistor for select share their gate insulating film as a common insulating film in which case the insulating film comprises an insulating film having a hysteresis characteristic and an insulating film formed on a gate electrode of the thin film transistor for select and having no hysteresis characteristic.

A memory element composed of stagger type thin film transistors can be fabricated by forming source and drain electrodes, a contact layer and a semiconductor layer, a gate insulating film having a hysteresis characteristic, a gate insulating film having no hysteresis characteristic, and a gate electrode. A memory element composed of coplanar type thin film transistors is manufactured by forming a semiconductor layer and a contact layer, source and drain electrodes, a gate insulating film having a hysteresis characteristic, a gate insulating film having no hysteresis characteristic, and a gate electrode in that order. A memory element composed of inverted coplanar type thin film transistors is fabricated by forming a gate electrode, a gate insulating film having no hysteresis characteristic, a gate insulating film having a hysteresis characteristic, source and drain electrodes, a contact layer and a semiconductor layer in that order.

Although the sixth embodiment of the present invention has been explained in connection with the memory element having the thin film transistors T61 and T62 connected to each other, the present invention is not restricted to that embodiment. For example, the present invention can be applied to the memory element having a select thin film transistor so as to select lines connected to the gate, source and drain electrodes of the thin film transistor for memory.

As set forth above, according to the present invention, a thin film transistor having a memory function and ordinary switching thin film transistor can be formed at one substrate.

The arrangement and operation of a memory circuit using memory element as set forth above will be explained below with reference to FIG. 19. The operation of this memory circuit differs the operation of general E²PROM.

Figure 19:
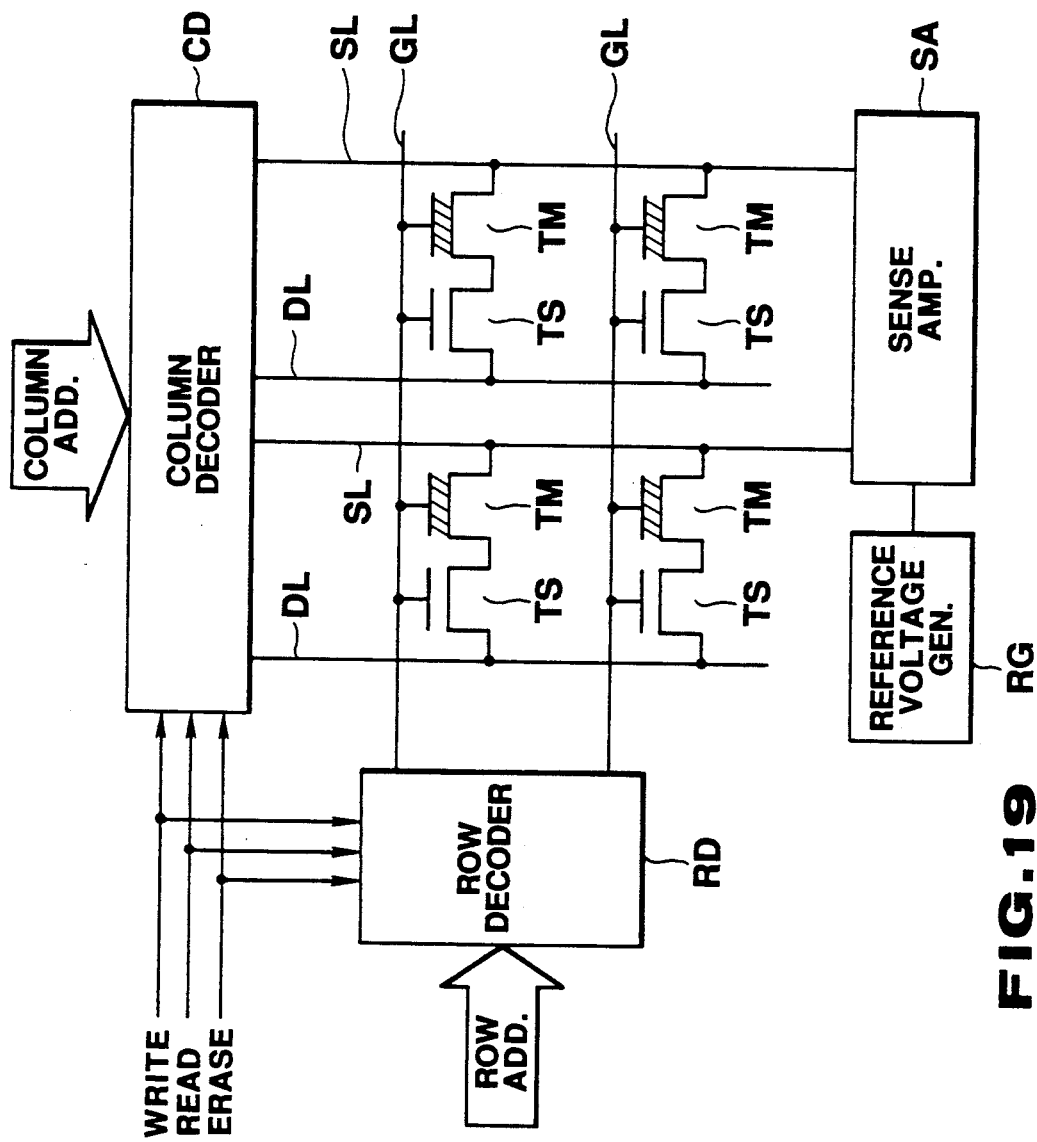
FIGS. 19 and 20 are circuit diagrams for explaining the form of use in the memory device of the present invention.

In the arrangement shown in FIG. 19, a transistor TM for an memory element has its current path connected in series with that of a transistor TS for select to form a pair of transistors. The transistor TM has a hysteresis characteristic and the select transistor TS has no hysteresis characteristic and is of such a switching type that it is turned ON when a voltage whose absolute value is greater than a predetermined level (for example +10 V or more or −10 V or less) is applied to the gate electrode of the select transistor TS. Such pairs of transistors TM, TS are connected in a matrix array. The gate line (word line) GL of transistors TM and TS on the same row is commonly connected to the gates of the transistors TM and TS. A drain line DL is commonly connected to the current path of each select transistor TS on the same column. One end of the current path of each memory transistor TM on the same column is connected to a source line (bit line) SL.

The gate line GL is connected to a row decoder RD and drain lines DL and source lines SL are commonly connected to a column decoder CD. The source lines SL are commonly connected to a sense amplifier SA. A reference voltage generator RG is connected to the sense amplifier SA. A row address, write control signal, read control and erase instruction signal are connected to the row decoder CD. A column address, write control signal, read control signal and erase instruction signal are connected to the column decoder CD.

The row decoder RD, column decoder CL and sense amplifier SA are composed of thin film transistors having no hysteresis characteristic.

A) Writing data (logic 1) into the memory element in the arrangement shown in FIG. 19 will be explained below.

The row and column addresses of the memory transistor TM to be accessed are supplied to the row decoder RD and column decoder CD with a write signal set at an active level. The row decoder RD is responsive to an input signal to set a voltage on a gate line GL of a corresponding row to, for example, Vp/2 in which case voltages on the other lines are set to, for example, 0 V. If, for example, the gate voltage can vary in a range from +40 V to −40 V, then Vp/2 is set to, for example, 20 V. The column decoder CD is responsive to an input signal to set a voltage on the drain and source lines DL and SL on the corresponding column to, for example, −Vp/2 (−20 V) in which case the other lines are set to, for example, 0 V. The select transistor TS is responsive to a corresponding gate voltage to turn the select transistor TS ON, allowing the −Vp/2 to be applied to the source and drain electrodes of a corresponding memory transistor. Thus a voltage Vp, that is, 40 V is applied to the gate-to-drain path (that is the gate insulating film) of the memory transistor. By so doing, a charge is trapped in the gate film of the selected memory transistor and thus data "1" is written into that memory transistor.

B) Erasing data (writing logic 0) will be explained below. First, row and column addresses of a corresponding memory transistor whose data is to be erased are supplied to the row decoder RD and column decoder CD with an erase signal set at an active level. The row decoder RD is responsive to an input signal to set a voltage on the gate line GL of the corresponding row to, for example, −Vp/2 in which case the other lines are set to, for example, 0 V. The column decoder CD is responsive to an input signal to set a voltage on the drain and source lines DL and SL of the corresponding column to, for example, +Vp/2 in which case voltages on the other lines are set to, for example, 0 V. The select transistor is responsive to the corresponding gate voltage to be turned ON, allowing +Vp/2 to be applied to the source and drain electrodes of the corresponding memory transistor. For this reason, a voltage −Vp is applied to the gate-to-drain path of that memory transistor TM. By so doing, a charge is trapped in the gate insulating film of the selected memory transistor and data "0" is written into the memory transistor TM.

C) Reading data from a memory element will be explained below. First, the row and column addresses of a corresponding memory transistor whose data is to be read therefrom are supplied to the row and column decoders RD and CD with a read signal set at an active level. The row decoder RD is responsive to a corresponding input signal to set a voltage on the gate line GL of the corresponding row to Von (for example, +10 V) in which case voltages on the other lines are set, for example, 0 V. The column decoder CD is responsive to a corresponding input signal to set a voltage on the drain line of the corresponding column to VD (for example, 10 V) in which case the source line SL is placed in a floating state. In response to the corresponding gate voltage, the selected transistors TS and TM are turned ON, allowing a current ID to flow from the drain line DL via the transistors TS, TM into the sense amplifier SA where a voltage on the source line SL is compared by the current ID with a reference voltage coming from the reference voltage generator RC. The current ID greatly varies depending upon the polarity of a charge trapped in the memory transistor TM, that is, data stored in the memory transistor TM. For this reason, the voltage on the source line SL greatly varies depending upon data stored in the memory transistor TM. Thus the sense amplifier SA is responsive to a result of comparison to determine the data corresponding to a charge trapped in the gate insulating film of the memory transistor TM and to deliver a corresponding output.

Figure 20:
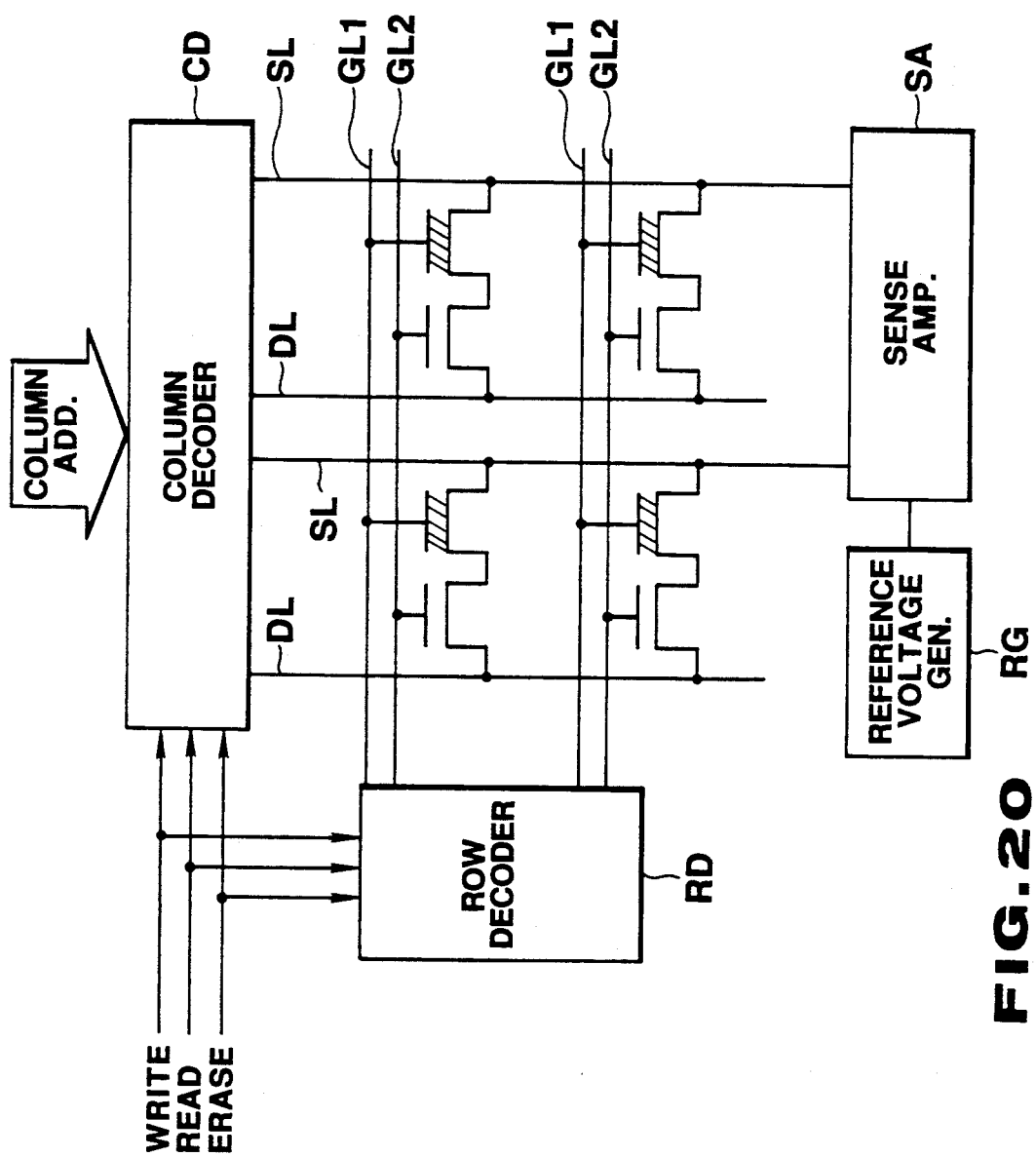

Another form of the memory circuit will be explained below with reference to FIG. 20.

The current path of a transistor TM for a memory element is connected in series with that of a select transistor TS to provide a pair of transistors. The select transistor TS is, for example, of an N-channel MOS type. Pairs of transistors TS, TM are arranged in matrix array. A first gate line GL1 is commonly connected to the gates of the memory transistors TM on the same row and a second gate line GL2 is connected to the gates of the select transistors TS on the same row. A drain line DL is connected to one end of a current path of the select transistors TS on the same column and a source line SL is connected to one end of a current path of the memory transistors TM on the same column. The gate lines GL1 and GL2 are connected to the row decoder RD. The drain line DL and source line SL are connected to the column decoder CL and the source lines SL are connected to a sense amplifier SA which is connected to a reference voltage generator RG. A row address, write control signal, read control signal and erase instruction signal are supplied to the row decoder RD. A column address, write control signal, read control signal and erase instruction signal are supplied to the column decoder CD. The memory transistor TM has a gate insulating film and transistors of which the row and column decoders RD and CL and sense amplifier SA are composed have no hysteresis characteristic.

The operation of the aforementioned memory circuit shown in FIG. 20 will be explained below.

A) Writing data (logic 1) into a memory element will be explained below in more detail. A row address and column address of the corresponding memory transistor are supplied to the row and column decoders RD and CD with a write signal set at an active level. The row decoder RD is responsive to a corresponding input signal to set a voltage on the first gate line GL1 of the corresponding row and a voltage on the second gate line GL2 of the corresponding row to, for example, Vp/2 (20 V) and Von (10 V), respectively, with voltages on the other lines set to, for example, 0 V. The column decoder CD is responsive to a corresponding input signal to set voltages on the drain line DL and source lines SL on the corresponding column to, for example, −Vp/2 (−20 V). The select transistor TS is responsive to the voltage Von to be turned ON, allowing a voltage Vp to be applied to the gate insulating film of the corresponding memory transistor TM. By doing so, a charge is trapped in the gate insulating film of the memory transistor TM and data "1" is written there.

B) Erasing "stored" data in the memory element (writing logic "0" there) will be explained below.

The row and column addresses of a memory transistor RD whose data is to be erased are supplied to the corresponding row and column decoders RD and CD with an erase signal set at an active level. The row decoder RD is responsive to a corresponding input signal to set a voltage on the first gate line GL1 of the corresponding row and a voltage on the second gate line GL2 of the corresponding row to, for example, −Vp/2 and Von, respectively, with the other lines set to 0 V. The column decoder CD is responsive to a corresponding signal to set voltages on the drain and source lines DL and SL of the corresponding column to, for example, +Vp/2 with the other lines set to 0 V. The select transistor TS is responsive to a voltage Von to be turned ON, allowing a voltage −Vp to be applied to the corresponding memory transistor TM. At this time, a charge is trapped in the gate insulting film and data "0" is stored there.

C) Reading data from the memory element will be explained below.

The row and column addresses of a corresponding memory transistor TM whose "stored" data is to be read out are supplied to the row and column decoders RD and CD with a read signal set at an active level. The row decoder RD is responsive to a corresponding input signal to set a voltage on the first gate line GL1 of the corresponding row and a voltage on the gate line GL2 to $V_{SELECT}$(0 V) and Von, respectively, with the other lines set to 0 V. The column decoder CD is responsive to a corresponding input signal to set a voltage on the drain line DL of the corresponding column to VD (for example, 10 V) with the source line SL set at a "floated" state. The selected transistors TS and TM are responsive to gate voltages $V_{SELECT}$ and Von to be turned ON, allowing a current ID to flow from the drain line DL via the transistors TS, TM and source line SL into the sense amplifier SA. The current ID greatly varies depending upon the content of data stored in the memory transistor TM. The voltage on the source line varies depending upon the contents of data which is stored in the memory transistor TM. The sense amplifier SA compares the voltage on the source line SL by the current ID with a reference voltage on the reference voltage generator RC and is responsive to a result of comparison to determine the data corresponding to a charge trapped in the gate insulating film of the memory transistor and to produce a corresponding output.

The aforementioned circuit arrangement and voltage relation are only exemplary. The relation of a voltage for "write" use and that for "erase" use may be reversed. For a data "write" operation, a voltage on the gate-drain circuit may be, for example, 10 V, 20 V, 30 V, etc.

As set forth above, according to the present invention a memory function can be imparted to the conventional thin film transistor and a resultant device of the present invention ensures an enhanced characteristic.

In the above embodiments, the semiconductor layers are mainly formed of i-a-silicon. The semiconductor layer may be formed of other material, for example, polysilicon, single crystal silicon, compound semiconductor, and semiconductor material including impurity. And also, in the above embodiments, the contact layers are formed of n+-a-silicon. The semiconductor layer may be formed of other material, for example, polysilicon, single crystal silicon, compound semiconductor material and semiconductor material including p type impurity.

What is claimed is:

1. A memory device comprising:
   a memory thin film transistor; and
   a select thin film transistor, coupled to the memory thin film transistor for selecting an operation of the memory thin film transistor;
   said memory thin film transistor including:
   a semiconductor layer,
   source and drain electrodes electrically connected to said semiconductor layer,
   a gate electrode for controlling formation of a channel of said semiconductor layer, and
   first insulating film means for insulating said gate electrode and said semiconductor layer from each other, said first insulating film means comprising a silicon nitride film whose Si/N composition ratio is 0.85 to 1.1; and
   said select thin film transistor including;
   a semiconductor layer,
   source and drain electrodes electrically connected to said semiconductor layer of said select thin film transistor,
   a gate electrode for controlling formation of said semiconductor layer of the select thin film transistor, and
   second insulating film means for insulating said gate electrode and said semiconductor layer of the select thin film transistor from each other, said second insulating film means comprising a silicon nitride film whose Si/N composition ratio is about 0.75.

2. The memory device according to claim 1, wherein said select thin film transistor is directly connected to said memory thin film transistor.

3. The memory device according to claim 1, wherein said first insulating film means includes a first insulating film and said second insulating film means includes a second insulating film which is thicker than the first insulating film.

4. The memory device according to claim 3, wherein:

said first and second insulating film means each include a
common insulating film.

5. The memory device according to claim 3, wherein said first and second insulating film means each include a film which is formed of a high dielectric material.

6. A memory device comprising:
a memory thin film transistor; and
a select thin film transistor, coupled to the memory thin film transistor for selecting an operation of the memory thin film transistor; said memory thin film transistor including:
a semiconductor layer,
source and drain electrodes electrically connected to said semiconductor layer,
a gate electrode for controlling formation of a channel of said semiconductor layer, and
first insulating film means directly coupled to said semiconductor layer for insulating said gate electrode and said semiconductor layer from each other, said first insulating film means including silicon nitride film whose Si/N composition ratio is 0.85 to 1.1 and means for trapping charges; and said select thin film transistor including;
a semiconductor layer,
source and drain electrodes electrically connected to said semiconductor layer of select thin film transistor,
a gate electrode for controlling formation of a channel of said semiconductor layer of said select thin film transistor, and
second insulating film means for insulating said gate electrode and said semiconductor layer of said select thin film transistor from each other, said second insulating film means having no means for effectively trapping charges.

7. A memory device including:
a memory thin film transistor; and
a select thin film transistor, coupled to said memory thin film transistor for selecting an operation of the memory thin film transistor;
said memory thin film transistor:
a semiconductor layer,
source and drain electrodes electrically connected to said semiconductor layer,
a gate electrode for controlling formation of a channel said semiconductor layer, and
first insulating film means directly coupled to said semiconductor layer for insulating said gate electrode and said semiconductor layer from each other, and
said select thin film transistor including;
a semiconductor layer,
source and drain electrodes electrically connected to said semiconductor layer of said select thin film transistor,
a gate electrode for controlling formation of a channel of said semiconductor layer of said select thin film transistor, and
second insulating film means directly coupled to said semiconductor layer for insulating said gate electrode and said semiconductor layer of said select thin film transistor from each other, and
wherein said first and second insulating film means each comprise a silicon nitride film whose Si/N composition ratio is 0.85 to 1.1; said silicon nitride film of said memory thin film transistor is used as it is; and said silicon nitride film of said select thin film transistor includes a redundant film other than silicon nitride film whose Si/N composition ratio is 0.85 to 1.1.

8. A memory device including:
a memory thin film transistor; and
a select thin film transistor, coupled to said memory thin film transistor for selecting an operation of said memory thin film transistor;
said memory thin film transistor including;
a semiconductor layer,
source and drain electrodes electrically connected to said semiconductor layer,
a gate electrode for controlling formation of a channel of said semiconductor layer; and
first insulating film means directly coupled to said semiconductor layer for insulating said gate electrode and said semiconductor layer from each other, and
said select thin film transistor including;
a semiconductor layer,
source and drain electrodes electrically connected to said semiconductor layer of said select thin film transistor;
a gate electrode for controlling formation of a channel of said semiconductor layer of said select thin film transistor; and
second insulating film means directly coupled to said semiconductor layer for insulating said gate electrode and said semiconductor layer of said select thin film transistor from each other; and
wherein said first and second insulating film means each comprise a silicon nitride film whose Si/N composition ratio is about 0.75; said silicon nitride film of said select thin film transistor is used as it is; and a portion of said silicon nitride film of said memory thin film transistor is Si ion-doped so that an Si/N composition ratio is 0.85 to 1.1.

* * * * *